(12) United States Patent
Chae et al.

(10) Patent No.: US 11,640,959 B2
(45) Date of Patent: May 2, 2023

(54) SEMICONDUCTOR DEVICE

(71) Applicant: SAMSUNG ELECTRONICS CO., LTD., Suwon-si (KR)

(72) Inventors: Jungkyu Chae, Seoul (KR); Kwanyoung Chun, Suwon-si (KR); Yoonjin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 16/931,585

(22) Filed: Jul. 17, 2020

(65) Prior Publication Data

US 2021/0151426 A1 May 20, 2021

(30) Foreign Application Priority Data

Nov. 18, 2019 (KR) .................. 10-2019-0147361

(51) Int. Cl.
*H01L 27/00* (2006.01)
*H01L 27/02* (2006.01)

(52) U.S. Cl.
CPC ............................ *H01L 27/0207* (2013.01)

(58) Field of Classification Search
CPC .................................................. H01L 27/0207
See application file for complete search history.

(56) References Cited

U.S. PATENT DOCUMENTS

| | | | | |
|---|---|---|---|---|
| 9,105,467 B2* | 8/2015 | Lee | ................ | H01L 27/1211 |
| 9,336,346 B2* | 5/2016 | Herberholz | ............ | H01L 27/092 |
| 9,514,260 B2* | 12/2016 | Kim | ....................... | G06F 30/392 |
| 10,026,661 B2* | 7/2018 | Won | ................ | H01L 21/823475 |
| 10,128,241 B2* | 11/2018 | Kim | ................ | H01L 21/823437 |
| 11,222,158 B2* | 1/2022 | Chae | .................... | G06F 30/3312 |
| 11,282,829 B2* | 3/2022 | Sio | ........................ | H01L 27/0924 |
| 2008/0111158 A1* | 5/2008 | Sherlekar | .............. | G06F 30/392 |
| | | | | 716/112 |
| 2010/0258798 A1* | 10/2010 | Sokel | ....................... | H01L 22/34 |
| | | | | 257/E27.001 |
| 2015/0084129 A1* | 3/2015 | Lee | ..................... | H01L 29/6681 |
| | | | | 257/401 |

(Continued)

FOREIGN PATENT DOCUMENTS

KR 10-2014-0021252 A 2/2014

*Primary Examiner* — Mounir S Amer
*Assistant Examiner* — Alexander Belousov
(74) *Attorney, Agent, or Firm* — Lee IP Law, P.C.

(57) ABSTRACT

A semiconductor device includes a pair of first and second dummy active regions extending in a first horizontal direction and spaced apart from each other in a second horizontal direction; a pair of first and second circuit active regions extending in the first horizontal direction and spaced apart in the second horizontal direction; and a plurality of line patterns extending in the second horizontal direction and spaced apart in the first horizontal direction. The pair of first and second dummy active regions may be between a pair of line patterns adjacent to each other among the plurality of line patterns. At least one of the first and second dummy active regions may have a width-changing portion in which a width of the at least one of the first and second dummy active regions changes in the second horizontal direction between the pair of line patterns adjacent to each other.

18 Claims, 40 Drawing Sheets

(56) References Cited

U.S. PATENT DOCUMENTS

| | | | | |
|---|---|---|---|---|
| 2015/0161314 A1* | 6/2015 | Kim | G06F 30/39 | |
| | | | 716/102 | |
| 2015/0213180 A1* | 7/2015 | Herberholz | H01L 23/00 | |
| | | | 716/119 | |
| 2016/0086863 A1* | 3/2016 | Won | G01R 31/2601 | |
| | | | 438/197 | |
| 2016/0092624 A1* | 3/2016 | Somayaji | G06F 30/392 | |
| | | | 716/119 | |
| 2018/0315743 A1* | 11/2018 | Takeno | H01L 23/5286 | |
| 2018/0365368 A1* | 12/2018 | Do | G06F 30/392 | |
| 2019/0012423 A1* | 1/2019 | Lee | G06F 30/398 | |
| 2019/0123063 A1* | 4/2019 | Hino | H01L 29/78696 | |
| 2019/0164993 A1* | 5/2019 | Shimbo | H01L 27/092 | |
| 2020/0357786 A1* | 11/2020 | Sio | H01L 27/0924 | |
| 2021/0151426 A1* | 5/2021 | Chae | H01L 27/0207 | |
| 2021/0165946 A1* | 6/2021 | Chae | G06F 30/392 | |
| 2021/0351174 A1* | 11/2021 | Sio | H01L 21/823871 | |
| 2022/0020691 A1* | 1/2022 | You | H01L 27/0924 | |
| 2022/0149033 A1* | 5/2022 | Sio | G06F 30/39 | |

\* cited by examiner

SEMICONDUCTOR DEVICE

CROSS-REFERENCE TO RELATED APPLICATION

Korean Patent Application No. 10-2019-0147361, filed on Nov. 18, 2019, in the Korean Intellectual Property Office, and entitled: "Semiconductor Device," is incorporated by reference herein in its entirety.

BACKGROUND

1. Field

Example embodiments relate to a semiconductor device.

2. Description of the Related Art

As the demand for high performance, high speed, and/or multifunctionality of a semiconductor device have increased, integration density of a semiconductor device has increased. A dummy region of a semiconductor device in which an integrated circuit is not disposed may limit an increase of integration density of a semiconductor device.

SUMMARY

Embodiments are directed to a semiconductor device, including a pair of first and second dummy active regions extending in a first horizontal direction and spaced apart from each other in a second horizontal direction perpendicular to the first horizontal direction; a pair of first and second circuit active regions extending in the first horizontal direction and spaced apart from each other in the second horizontal direction; and a plurality of line patterns extending in the second horizontal direction and spaced apart from each other in the first horizontal direction. The pair of first and second dummy active regions may be disposed between a pair of line patterns adjacent to each other among the plurality of line patterns. At least one of the first and second dummy active regions may have a width-changing portion, the width-changing portion being a portion in which a width of the at least one of the first and second dummy active regions changes in the second horizontal direction between the pair of line patterns adjacent to each other.

Embodiments are also directed to a semiconductor device, including a semiconductor substrate; a first active line extending on the semiconductor substrate in a first horizontal direction and crossing a first circuit region, a dummy region, and a second circuit region; a second active line extending on the semiconductor substrate in the first horizontal direction and crossing the first circuit region, the dummy region, and the second circuit region; and line patterns extending on the semiconductor substrate in a second horizontal direction perpendicular to the first horizontal direction. The first active line may be disposed in an N-well region of the semiconductor substrate. The second active line may be spaced apart from the N-well region of the semiconductor substrate. The dummy region may be disposed between the first circuit region and the second circuit region. The first active line may include a first circuit active portion in the first circuit region, a first dummy active portion in the dummy region, and a second circuit active portion in the second circuit region. The second active line may include a third circuit active portion in the first circuit region, a second dummy active portion in the dummy region, and a fourth circuit active portion in the second circuit region. At least a portion of the first dummy active portion may have a width different from a width of at least a portion of the second dummy active portion.

Embodiments are also directed to a semiconductor device, including a semiconductor substrate; an active line extending on the semiconductor substrate in a first horizontal direction and crossing a circuit region and a dummy region; line patterns extending on the semiconductor substrate in a second horizontal direction perpendicular to the first horizontal direction; circuit source/drain regions and dummy source/drain regions above the active line; and a plurality of semiconductor layers disposed on the active line in the circuit region. Each of the line patterns may include a gate line crossing the plurality of semiconductor layers and covering an upper surface, a side surface, and a lower surface of each of the plurality of semiconductor layers. The line patterns may include a pair of dummy lines disposed on both sides of the dummy source/drain region and adjacent to each other. The active line below the dummy source/drain regions may include a first width portion having a first width, a second width portion having a second width different from the first width, and a first width-changing portion between the first width portion and the second width portion. The first width portion may be disposed between the pair of dummy lines.

BRIEF DESCRIPTION OF DRAWINGS

Features will become apparent to those of skill in the art by describing in detail example embodiments with reference to the attached drawings in which.

DETAILED DESCRIPTION

Figure 1:
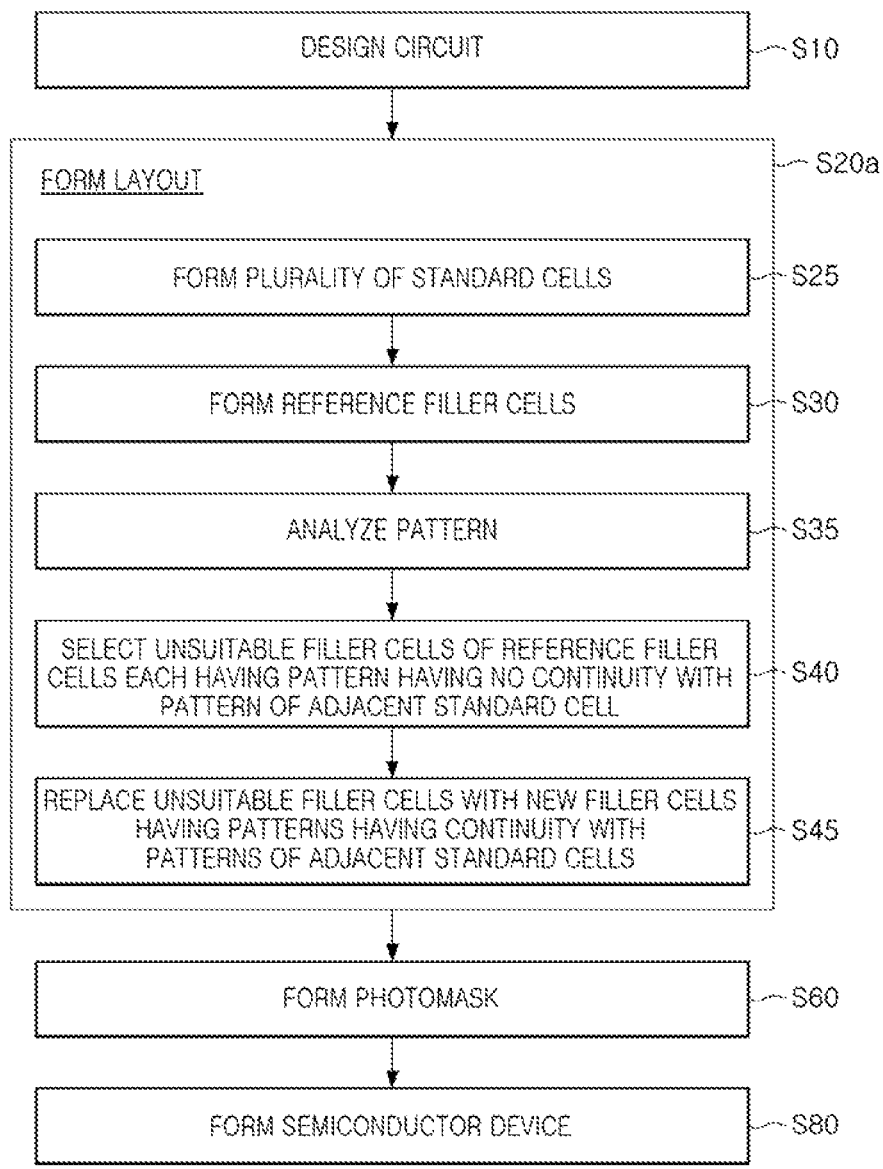
FIG. 1 is a flowchart illustrating a method of manufacturing a semiconductor device.

FIG. 1 is a flowchart illustrating a method of manufacturing a semiconductor device.

Referring to FIG. 1, a circuit may be designed (S10). The designing of a circuit may include designing an integrated circuit of a semiconductor device. A layout may be formed (S20a). The layout may be formed using the integrated circuit formed according to the designing a circuit. The forming of the layout (S20a) may include forming a plurality of standard cells (S25), forming reference filler cells (S30), analyzing a pattern (S35), selecting unsuitable filler cells of the reference filler cells (each of the unsuitable filler cells having a pattern having no continuity with a pattern of an adjacent standard cell) (S40), and replacing the unsuitable filler cells with new filler cells having patterns having continuity with patterns of the adjacent standard cells (S45). A photomask may be formed (S60). The photomask may be formed using the above-described layout. A semiconductor device may be manufactured (S80). The semiconductor device may be formed using the photomask.

Figure 2:
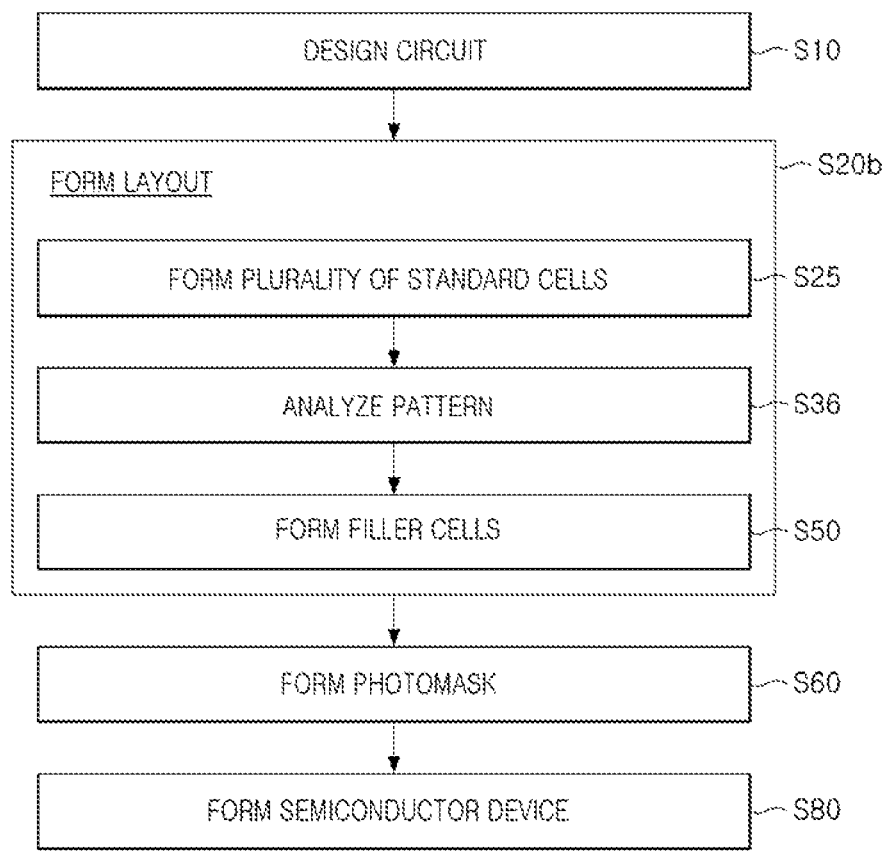
FIG. 2 is a flowchart illustrating a modified example of a method of manufacturing a semiconductor device.

A modified example of the forming of the layout will be described with reference to FIG. 2. FIG. 2 is a flowchart illustrating a modified example of a method of manufacturing a semiconductor device.

Referring to FIG. 2, the forming of the layout (S20b) may include forming a plurality of standard cells (S25), analyzing a pattern (S36), and forming filler cells (S50). The analyzing a pattern (S36) may include extracting information on a width of each of patterns of the plurality of standard cells. The forming filler cells (S50) may include forming filler cells including patterns having continuity with patterns of the plurality of standard cells in a region adjacent to the plurality of standard cells.

In the description below, an example of the forming of the layout (S20a in FIG. 1 and S20b in FIG. 2) will be described with reference to FIGS. 3A to 7.

A planar shape of a semiconductor device in the example embodiment will be described with reference to FIGS. 3A and 3B.

Figure 3A:
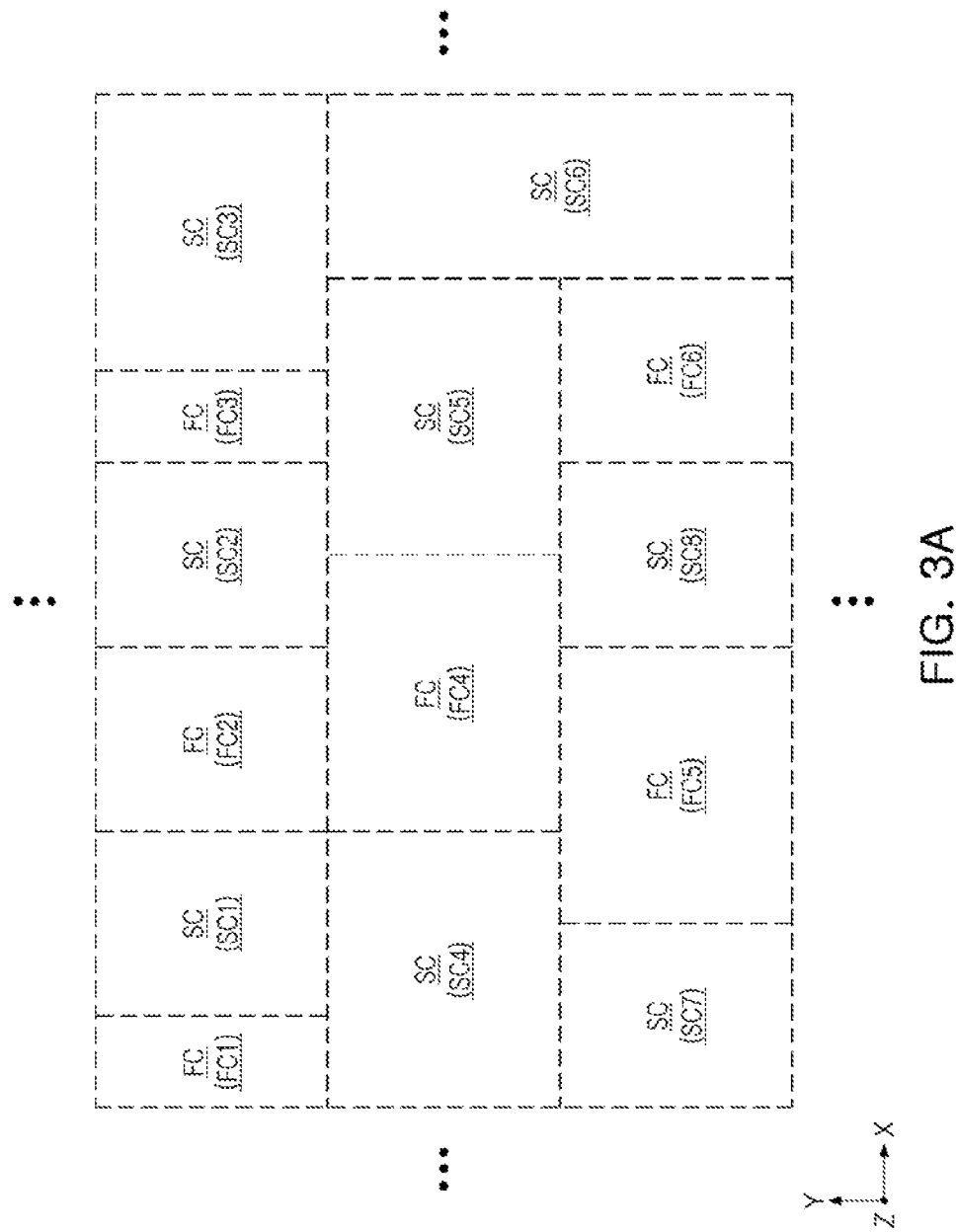
FIGS. 3A and 3B are plan diagrams illustrating a semiconductor device according to an example embodiment.

FIG. 3A is a plan diagram illustrating a circuit region and a dummy region of a semiconductor device according to an example embodiment. FIG. 3B is a plan diagram illustrating the example illustrated in FIG. 3A which further includes power wirings M1 (VDD, VSS) and line patterns GL.

Figure 3B:
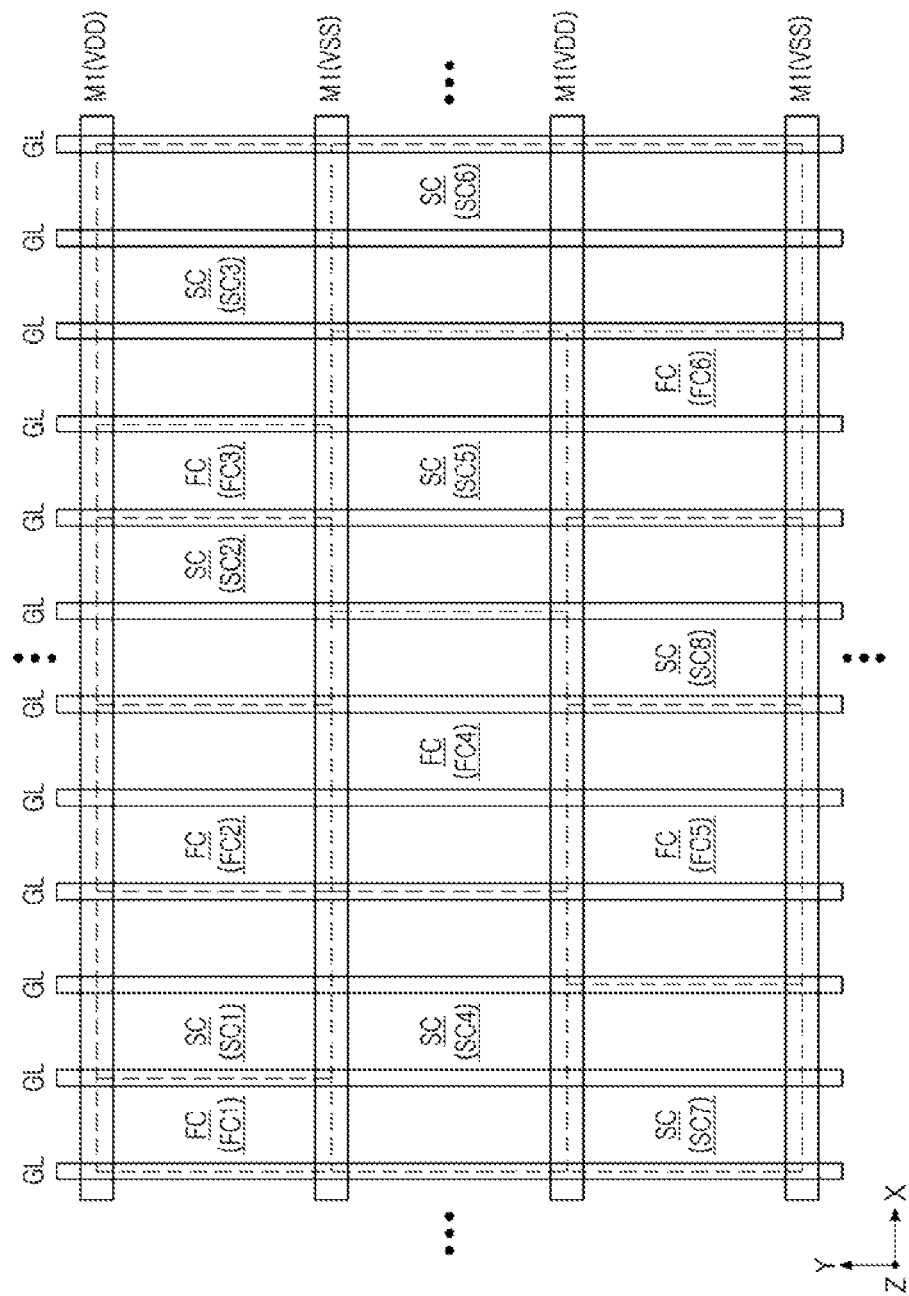

Referring to FIGS. 3A and 3B, the semiconductor device according to the present example embodiment may include a plurality of standard cell regions SC and a plurality of filler cell regions FC adjacent to the plurality of standard cell regions SC. The plurality of standard cell regions SC may be defined as circuit regions, and the plurality of filler cell regions FC may be defined as dummy regions.

FIGS. 3A and 3B illustrate an example in which the plurality of standard cell regions SC include first to eighth standard cell regions SC1 to SC8, but the plurality of standard cell regions SC may include standard cell regions arranged in various other forms and numbers. FIGS. 3A and 3B illustrate an example in which the plurality of filler cell regions FC include first to sixth filler cell regions FC1 to FC6, but the plurality of filler cell regions FC may include filler cell regions arranged in various other forms and numbers.

Referring to FIG. 3B, the power wirings M1 (VDD, VSS) may be disposed to extend in a first horizontal direction (X). The power wirings M1 (VDD, VSS) may be spaced apart from each other in a second horizontal direction (Y) perpendicular to the first horizontal direction (X). The power wirings M1 (VDD, VSS) may include a first power wiring VDD and a second power wiring VSS. The line patterns GL may be disposed to extend in the second horizontal direction (Y). The line patterns GL may include gate lines and dummy lines.

In the description below, an example of standard cells will be described with reference to FIGS. 4A to 4C according to an example embodiment.

Figure 4A:
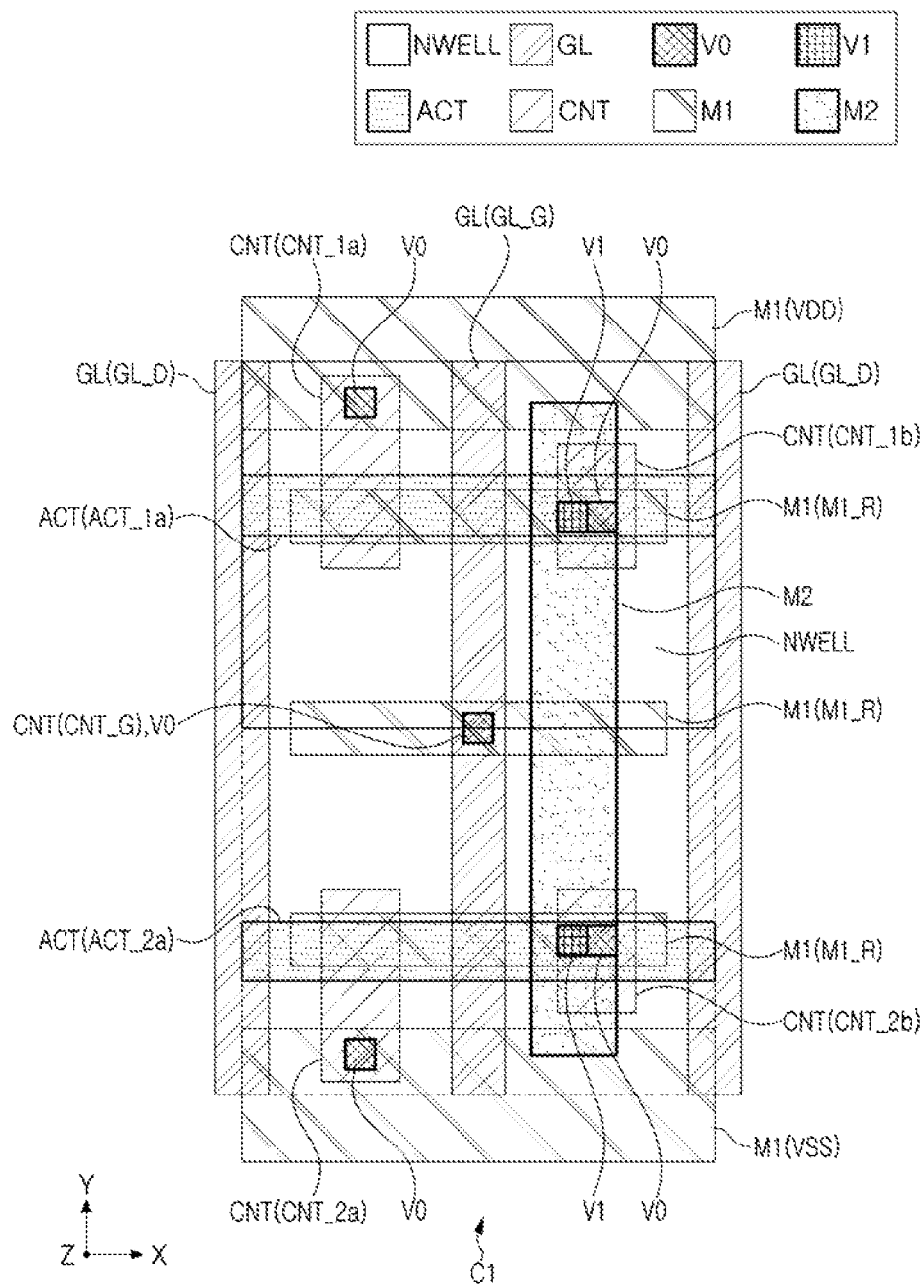
FIGS. 4A to 4C are plan diagrams illustrating standard cells included in a semiconductor device according to an example embodiment.
Figure 4B:
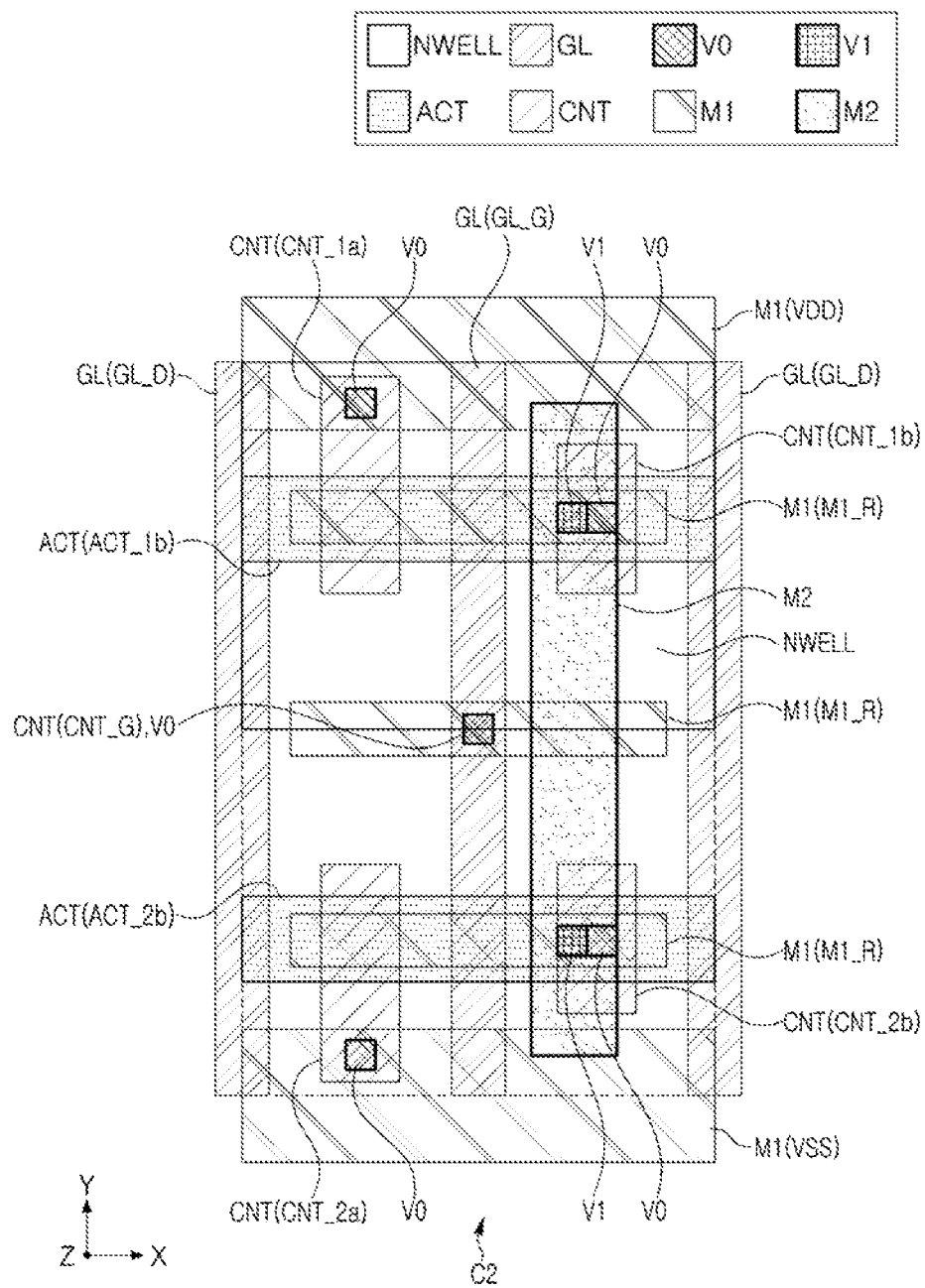
Figure 4C:
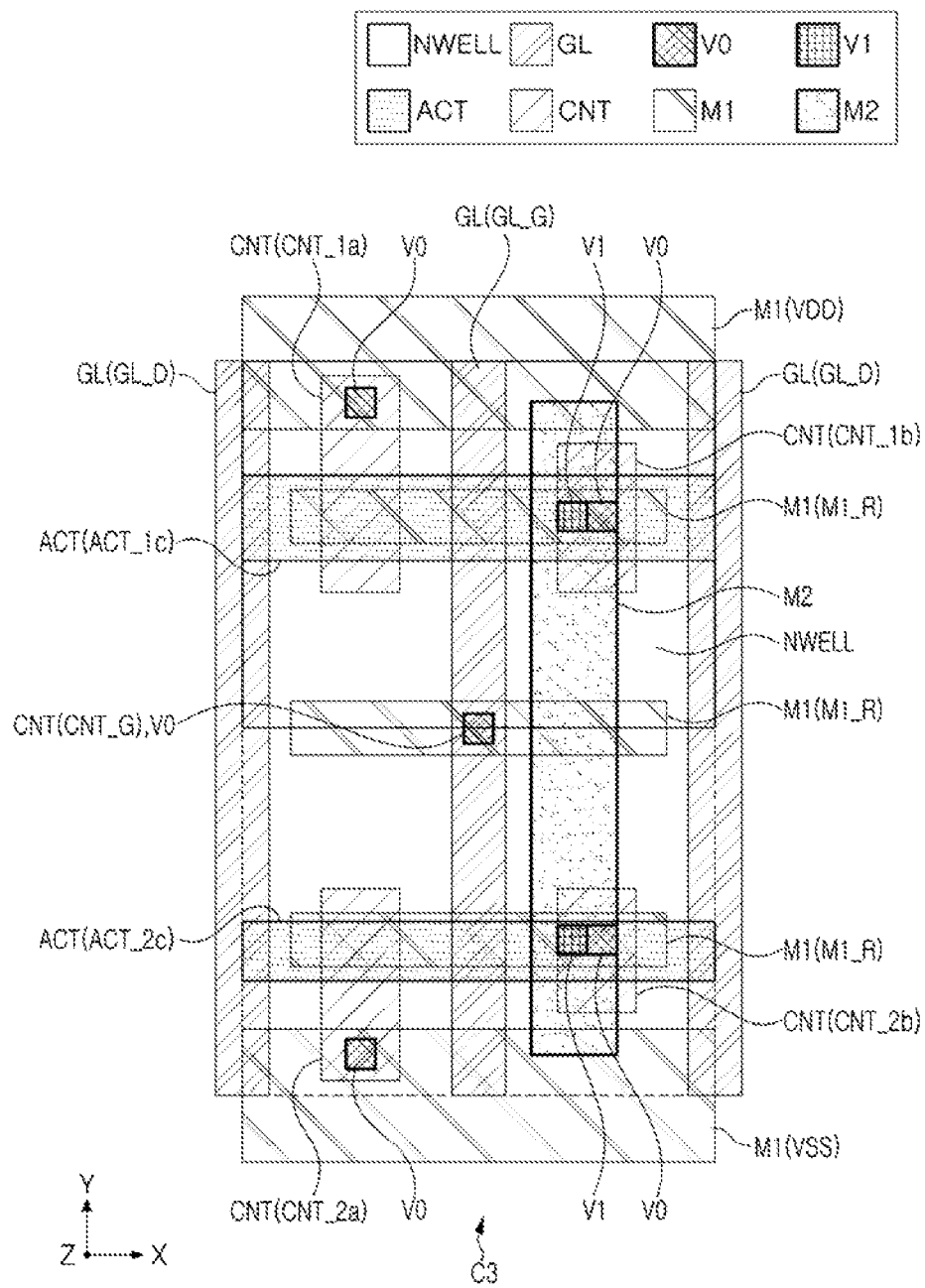

FIGS. 4A to 4C are plan diagrams illustrating standard cells included in a semiconductor device according to an example embodiment.

Referring to FIGS. 4A to 4C, the semiconductor device according to the present example embodiment may include standard cells filling a plurality of standard cell regions (the standard cell regions SC in FIGS. 3A and 3B), configured as a unit of the layout included in the integrated circuit. The standard cells may include various types of standard cells such as inverter standard cells, NAND standard cells, NOR standard cells, or the like. For example, first to third standard cells C1, C2, and C3 illustrated in FIGS. 4A to 4C may be implemented as inverter standard cells among standard cells.

The first to third standard cells C1, C2, and C3 illustrated in FIGS. 4A to 4C may include a pair of active lines ACT extending in the first horizontal direction (X), an N-well region NWELL, a plurality of line patterns GL extending in the second horizontal direction (Y) perpendicular to the first horizontal direction (X), a plurality of contact plugs CNT, a plurality of lower wirings M1 extending in the second horizontal direction (Y), a plurality of lower vias V0, a plurality of upper vias V1, and an upper wiring M2 extending in the first horizontal direction (X).

The plurality of line patterns GL may include dummy lines GL_D spaced apart from each other and gate lines GL_G disposed among the dummy lines GL_D. The gate lines GL_G may cross the pair of active lines ACT.

The plurality of lower wirings M1 may include a pair of first and second power wirings VDD and VSS and a plurality of routing wirings M1_R.

The pair of active lines ACT may include a first active line (denoted as "ACT_1a" in FIG. 4A, "ACT_1b" in FIG. 4B, and "ACT_1c" in FIG. 4C) and a second active line (denoted as "ACT_2a" in FIG. 4A, "ACT_2b" in FIG. 4B, and "ACT_2c" in FIG. 4C).

The first active line ("ACT_1a" in FIG. 4A, "ACT_1b" in FIG. 4B, and "ACT_1c" in FIG. 4C) may be disposed in the N-well region NWELL. The first active line ("ACT_1a" in FIG. 4A, "ACT_1b" in FIG. 4B, and "ACT_1c" in FIG. 4C) disposed in the N-well region NWELL may have N-type conductivity, and the second active line ("ACT_2a" in FIG. 4A, "ACT_2b" in FIG. 4B, and "ACT_2c" in FIG. 4C) that is not disposed in the N-well region NWELL may have P-type conductivity. Accordingly, the first active line ("ACT_1a" in FIG. 4A, "ACT_1b" in FIG. 4B, and "ACT_1c" in FIG. 4C) having N-type conductivity may be configured as an active region in which a PMOS transistor is disposed, and the second active line ("ACT_2a" in FIG. 4A, "ACT_2b" in FIG. 4B, and "ACT_2c" in FIG. 4C) having P-type conductivity may be configured as an active region in which an NMOS transistor is disposed.

In the example embodiment described below, the first active line disposed in the N-well region NWELL may have N-type conductivity, and the second active line (which opposes the first active line and is not disposed in the N-well region NWELL) may have P-type conductivity.

The plurality of contact plugs CNT may include a first contact plug CNT_1a and a second contact plug CNT_1b disposed on both sides of the gate line GL_G and overlapping the first active line ("ACT_1a" in FIG. 4A, "ACT_1b" in FIG. 4B, and "ACT_1c" in FIG. 4C), and a third contact plug CNT_2a and a fourth contact plug CNT_2b disposed on both sides of the gate line GL_G and overlapping the second active line ("ACT_2a" in FIG. 4A, "ACT_2b" in FIG. 4B, and "ACT_2c" in FIG. 4C). The plurality of contact plugs CNT may further include a gate contact plug CNT_G overlapping the gate line GL_G. The first to fourth contact plugs CNT_1a, CNT_1b, CNT_2a, and CNT_2b may be referred to as "source/drain contact plugs." The first contact plug CNT_1a may be referred to as a first source/drain contact plug.

A length of the first contact plug CNT_1a in the second horizontal direction (Y) may be different from a length of the second contact plug CNT_1b in the second horizontal direction (Y). For example, a length of the first contact plug CNT_1a in the second horizontal direction (Y) may be greater than a length of the second contact plug CNT_1b in the second horizontal direction (Y). A length of the third contact plug CNT_2a in the second horizontal direction (Y) may be greater than a length of the fourth contact plug CNT_2b in the second horizontal direction (Y).

A portion of the first contact plug CNT_1a may overlap the first power wiring VDD, and a portion of the third contact plug CNT_2a may overlap the second power wiring VSS. The lower via V0 disposed between the first contact plug CNT_1a and the first power wiring VDD may electrically connect the first contact plug CNT_1a to the first power wiring VDD, and the lower via V0 disposed between the third contact plug CNT_2a and the second power wiring VSS may electrically connect the third contact plug CNT_2a to the second power wiring VSS.

In an example embodiment, the second and fourth contact plugs CNT_1b and CNT_2b may be electrically connected to the routing wirings M1_R through the lower vias V0 overlapping the second and fourth contact plugs CNT_1b and CNT_2b.

In an example embodiment, the gate contact plug CNT_G may be electrically connected to the routing wiring M1_R through the lower vias V0 overlapping the gate contact plug CNT_G.

In an example embodiment, the upper wiring M2 may include a portion overlapping the second and fourth contact plugs CNT_1b and CNT_2b. The upper wiring M2 may be electrically connected to the routing wirings M1_R through the upper vias V1 on the routing wirings M1_R overlapping the second and fourth contact plugs CNT_1b and CNT_2b.

In the first standard cell C1 (in FIG. 4A), each of the first active line ACT_1a (in FIG. 4A) and the second active line ACT_2a (in FIG. 4A) may have a first width in the second horizontal direction (Y).

In the second standard cell C2 (in FIG. 4B), each of the first active line ACT_1b (in FIG. 4B) and the second active line ACT_2b (in FIG. 4B) may have a second width in the second horizontal direction (Y). The second width may be less than the first width.

The third standard cell C3 (in FIG. 4C), the first active line ACT_1c (in FIG. 4C) and the second active line ACT_2c (in FIG. 4C) may have different widths in the second horizontal direction (Y). For example, in the third standard cell C3 (in FIG. 4C), the first active line ACT_1c (in FIG. 4C) may have the first width in the second horizontal direction (Y), and the second active line ACT_2c (in FIG. 4C) may have the second width in the second horizontal direction (Y).

In the description below, an example of filler cells will be described with reference to FIGS. 5A to 5G according to an example embodiment.

FIGS. 5A to 5J are plan diagrams illustrating filler cells included in a semiconductor device according to an example embodiment.

Referring to FIGS. 5A to 5J, the semiconductor device according to the present example embodiment may include filler cells configured as a unit of a layout included in an integrated circuit. For example, first to twenty-eighth filler cells F1 to F28 illustrated in FIGS. 5A to 5J may include a pair of first and second active lines ACT (ACT_1, ACT_2), an N-well region NWELL, a pair of first and second line patterns GL (GL_D1, GL_D2), a pair of first and second power wirings M1 (VDD and VSS), and contact plugs CNT. The first active line ACT_1 may be disposed in the N-well region NWELL.

In each of the first to twenty-eighth filler cells F1 to F28, the contact plugs CNT may include a contact plug overlapping the first active line ACT_1 and a contact plug overlapping the second active line ACT_2. The contact plugs CNT may be disposed in a middle portion between the pair of first and second line patterns GL_D1 and GL_D2 adjacent to each other.

The contact plugs CNT may overlap the first and second active lines ACT (ACT_1, ACT_2). A shape and a size of each of the contact plugs CNT may be varied relative to the examples illustrated in the diagram.

In another example embodiment, the contact plugs CNT may be omitted in each of the first to twenty-eighth filler cells F1 to F28. In addition to the first to twenty-eighth filler cells F1 to F28, different filler cells, which will be described below, may or may not include the contact plugs CNT. Thus, in the description of the filler cell below, the example embodiment may include both the example in which the filler cell includes a contact plug and the example in which the filler cell does not include a contact plug.

In each of the first to twenty-eighth filler cells F1 to F28, the pair of first and second line patterns GL (GL_D1, GL_D2) may be configured as dummy lines GL_D.

In the filler cells, the active lines ACT may be patterns that correspond to the standard cells. For example, the active lines ACT of the first to third standard cells C1 to C3 (in FIGS. 4A to 4C) may correspond to the active lines ACT of the first to twenty-eighth filler cells F1 to F28.

The first to twenty-eighth filler cells F1 to F28 may have various shapes to have patterns having continuity with patterns of the standard cells described above. For example, the first to twenty-eighth filler cells F1 to F28 may include the first to fourth filler cells F1 to F4 having active lines ACT each of which does not have a width-changing portion in a single filler cell, and the fifth to twenty-eighth filler cells F5 to F28 having active lines ACT each of which has a width-changing portion in a single filler cell. In the first active lines ACT_1 of the first to twenty-eighth filler cells F1 to F28, a portion of the first active line having a first width in the second horizontal direction (Y) may be indicated as "first dummy portion" (W_A1a), and a portion of the first active line having a second width less than the first width in the second horizontal direction (Y) may be indicated as "second dummy portion" (W_A1b). In the second active lines ACT_2 of the first to twenty-eighth filler cells F1 to F28, a portion of the second active line having the first width may be indicated as "third dummy portion" (W_A2a), and a portion of the second active line having the second width may be indicated as "fourth dummy portion" (W_A2b).

Figure 5A:
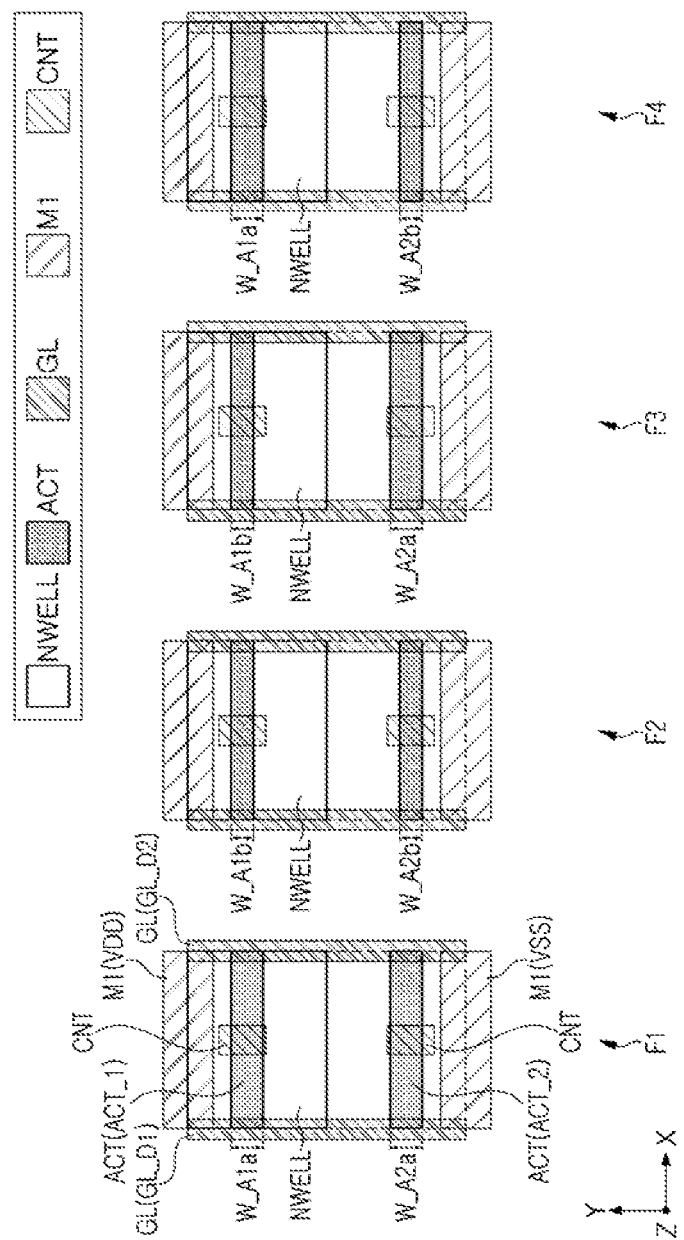
FIGS. 5A to 5J are plan diagrams illustrating filler cells included in a semiconductor device according to an example embodiment.

Referring to FIG. 5A, in the first to fourth filler cells F1 to F4, the first and second active lines ACT_1 and ACT_2 of the first filler cell F1 may have the same width in the second horizontal direction (Y), and the first and second active lines ACT_1 and ACT_2 of the second filler cell F2 may have the same width in the second horizontal direction (Y) and the width smaller than the width of each of the first and second active lines ACT_1 and ACT_2 of the first filler cell F1, the first active line ACT_1 of the third filler cell F3 may have a width smaller than the width of the second active line ACT_2 of the third filler cell F3 in the second horizontal direction (Y), and the first active line ACT_1 of the fourth filler cell F4 may have a width greater than the width of the second active line ACT_2 of the fourth filler cell F4 in the second horizontal direction (Y).

Figure 5B:
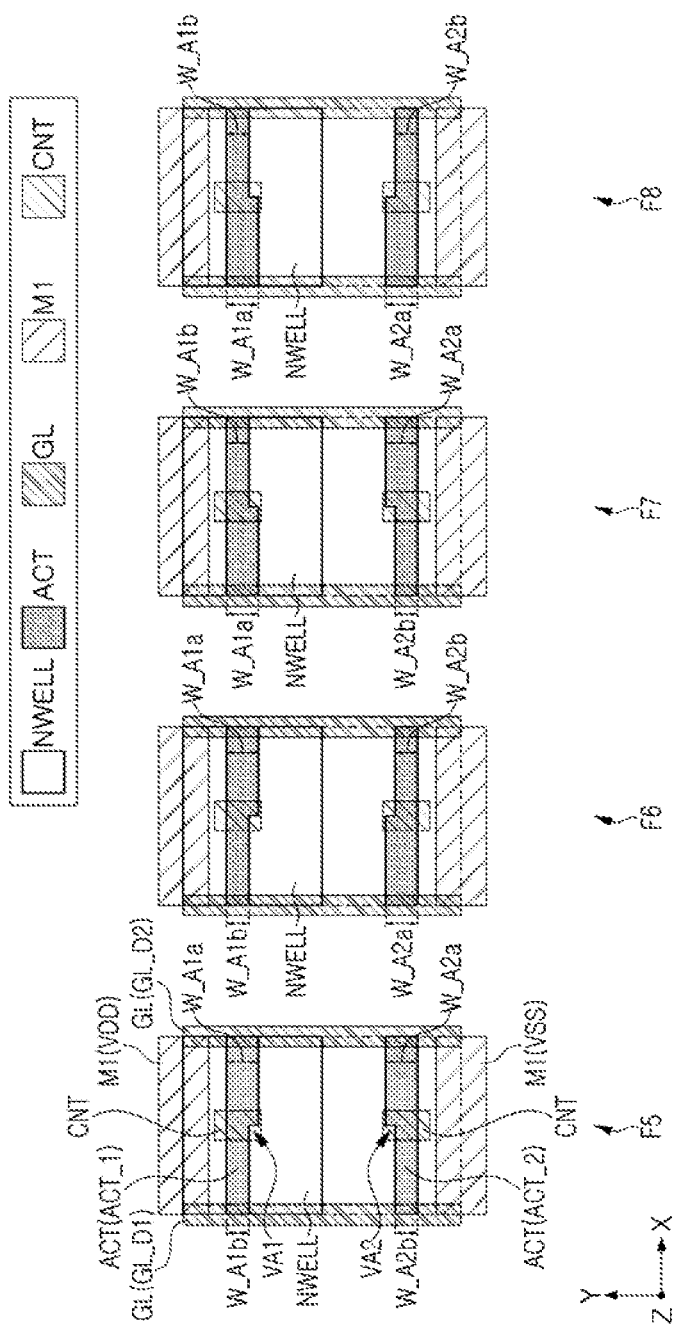
Figure 5C:
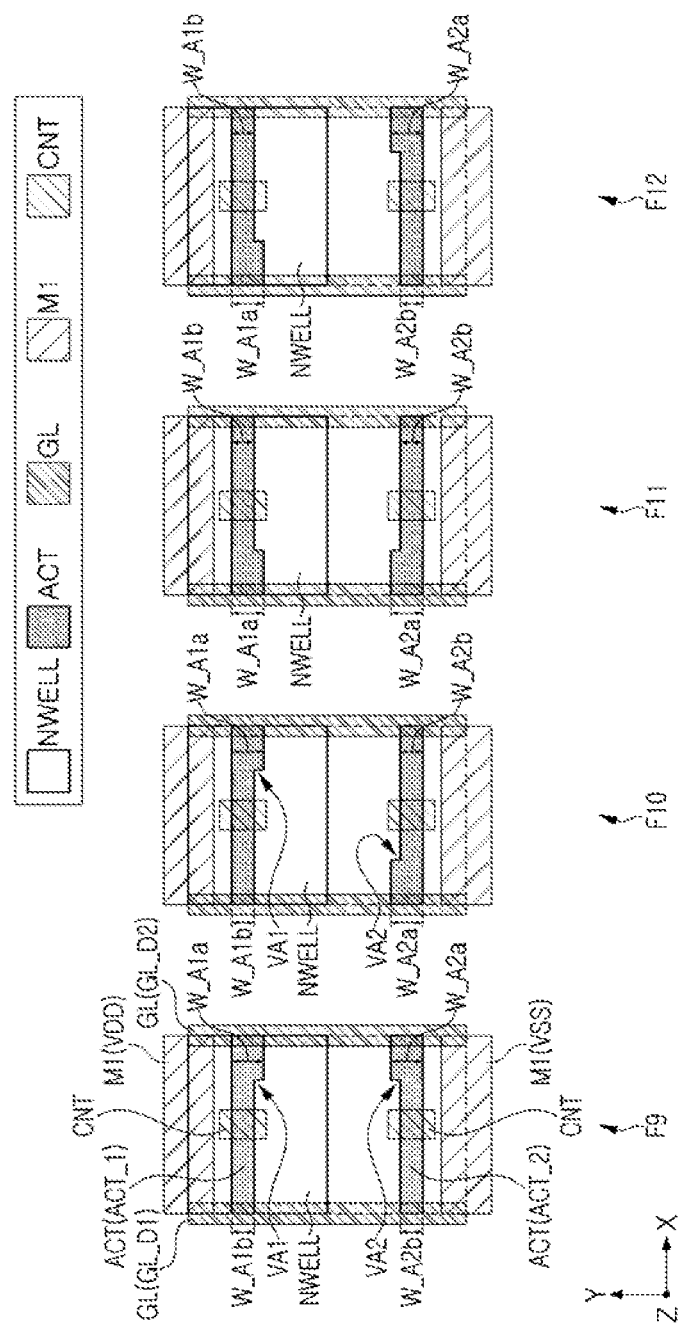

Referring to FIGS. 5B and 5C, in the fifth to twelfth filler cells F5 to F12, the first active line ACT_1 may include both the first dummy portion W_A1a and the second dummy portion W_A1b having different widths in the second horizontal direction (Y), and the second active line ACT_2 may include both the third dummy portion W_A2a and the second dummy portion W_A1b having different widths in the second horizontal direction (Y). Accordingly, in the fifth to twelfth filler cells F5 to F12, the first active line ACT_1 may have a first width-changing portion VA1 between the first dummy portion W_A1a and the second dummy portion W_A1b having different widths in the second horizontal direction (Y), and the second active line ACT_2 may have a second width-changing portion VA2 between the third dummy portion W_A2a and the second dummy portion W_A1b having different widths in the second horizontal direction (Y).

Referring to FIG. 5B, in the fifth to eighth filler cells F5 to F8, each of the first width-changing portion VA1 of the first active line ACT_1 and the second width-changing portion VA2 of the second active line ACT_2 may be disposed in a middle portion between the pair of first and second line patterns GL (GL_D1 and GL_D2).

Referring to FIG. 5C, in the each of the first width-changing portion VA1 of the first active line ACT_1 and the second width-changing portion VA2 of the second active line ACT_2 may be disposed adjacent to one of the pair of first and second line patterns GL (GL_D1 and GL_D2). For example, in the ninth filler cell F9, the first and second width-changing portions VA1 and VA2 may be disposed adjacent to the second line pattern GL_D2. In the tenth filler cell F10, the first width-changing portion VA1 may be disposed adjacent to the second line pattern GL_D2, and the second width-changing portion VA2 may be disposed adjacent to the first line pattern GL_D1. In the eleventh filler cell F11, the first and second width-changing portions VA1 and VA2 may be disposed adjacent to the first line pattern GL_D1. In the twelfth filler cell F12, the first width-changing portion VA1 may be disposed adjacent to the first line pattern GL_D1, and the second width-changing portion VA2 may be disposed adjacent to the second line pattern GL_D2.

Referring to FIGS. 5D to 5G, in the thirteenth to twenty-eighth filler cells F13 to F28, one of the first and second active lines ACT_1 and ACT_2 may have a constant width in the second horizontal direction (Y), and the other may have a width-changing portion.

Figure 5D:
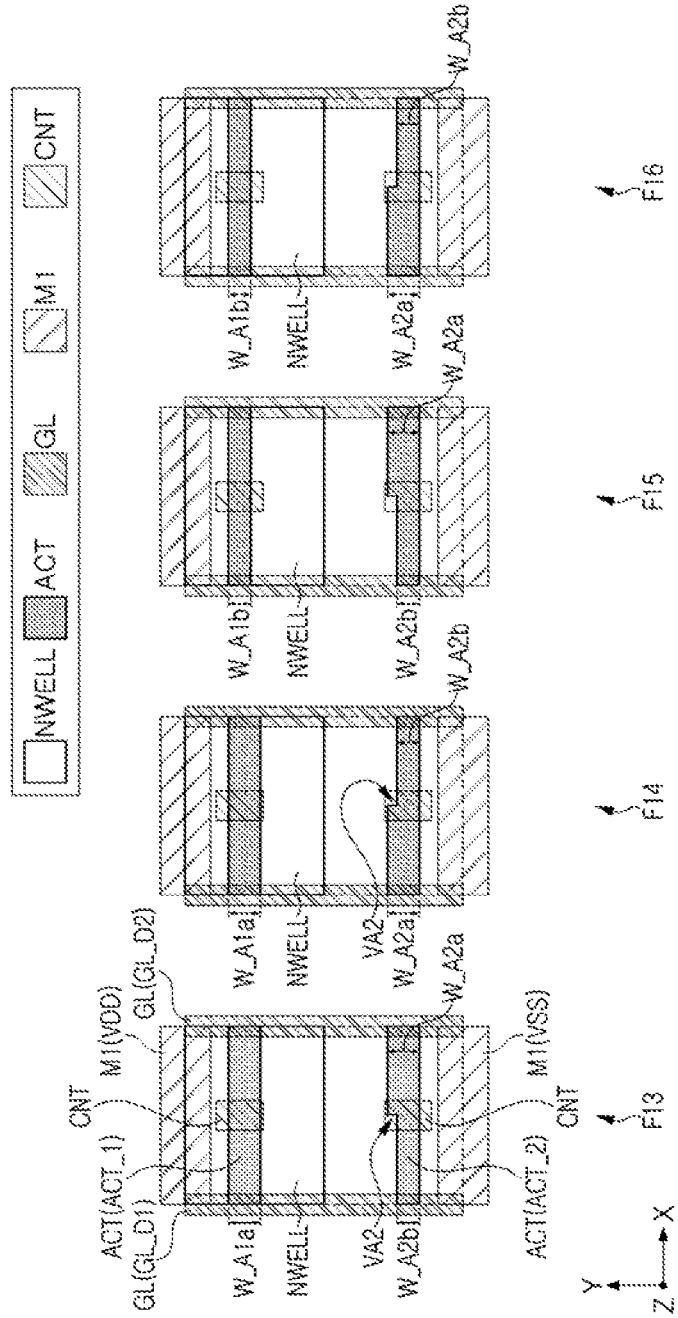
Figure 5E:
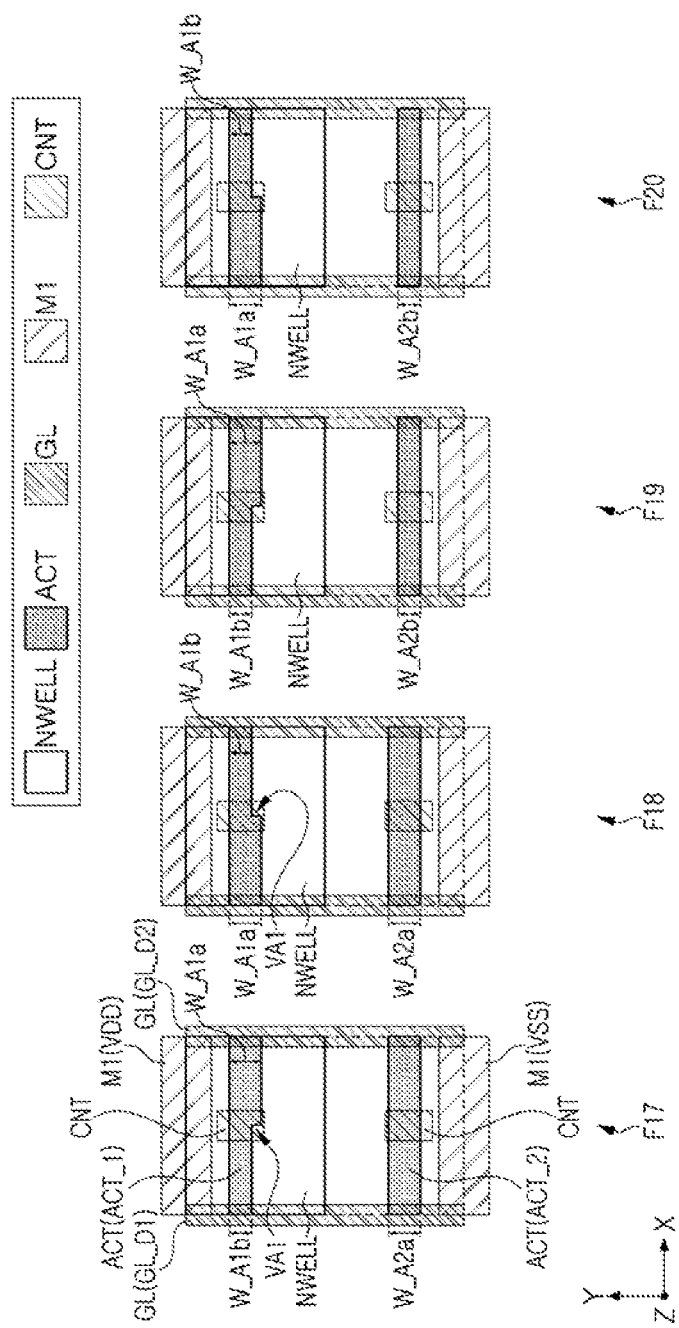

Referring to FIGS. 5D and 5E, in the thirteenth to twentieth filler cells F13 to F20, one of the first and second active lines ACT_1 and ACT_2 may have a constant width in the second horizontal direction (Y), and the other may have a width-changing portion in a middle portion between the first and second line patterns GL_D1 and GL_D2, e.g., the width in the second horizontal direction (Y) of the second active line ACT_2 may change approximately midway between the first and second line patterns GL_D1 and GL_D2 in the first horizontal direction (X).

Figure 5F:
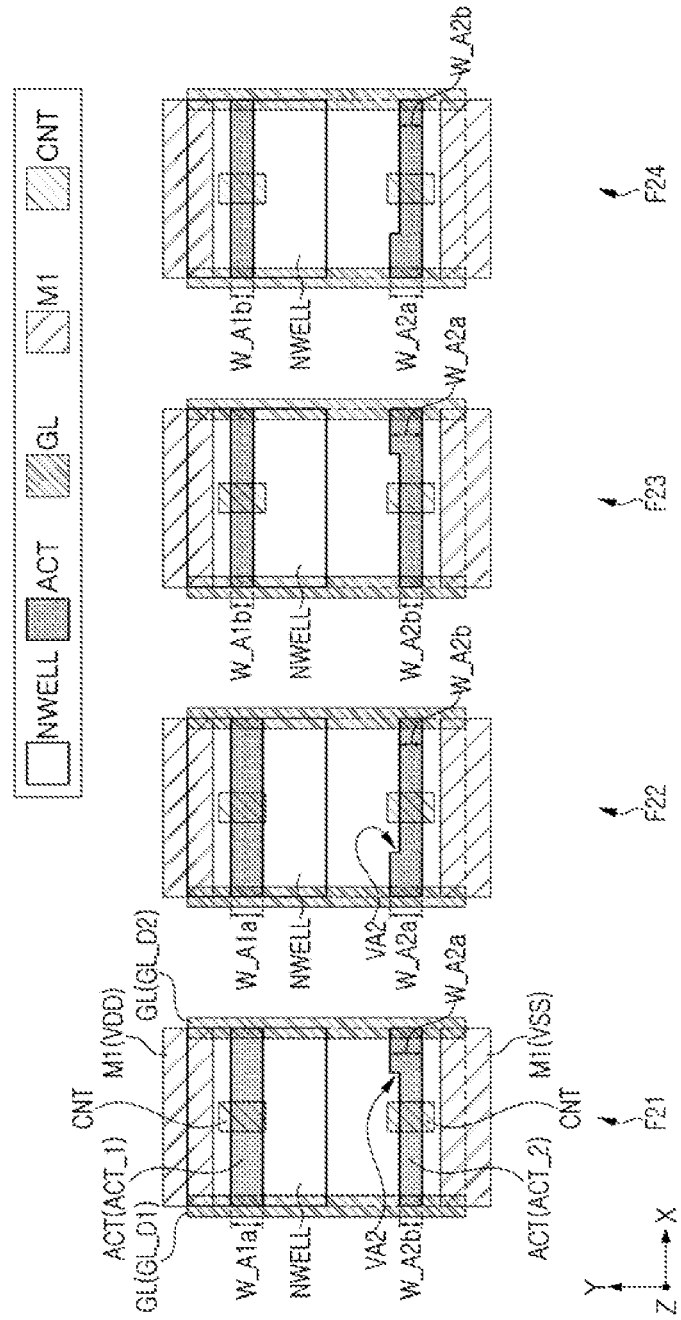
Figure 5G:
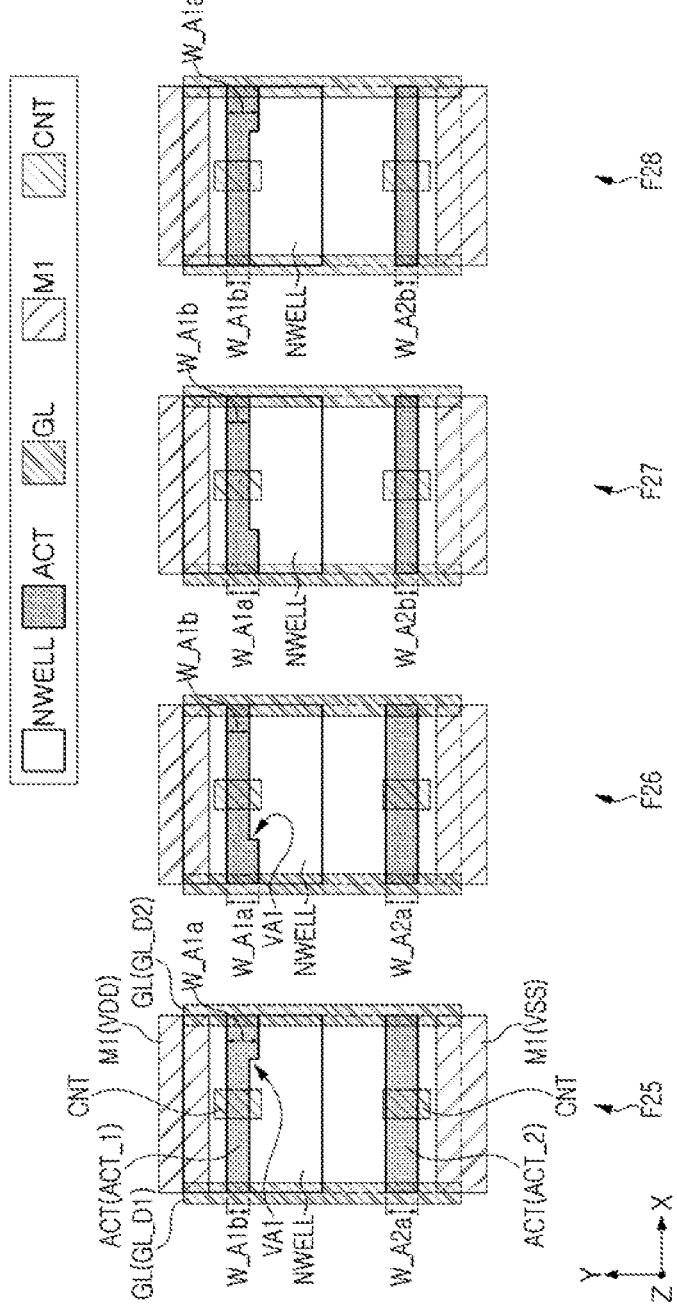

Referring to FIGS. 5F and 5G, in the twenty first to twenty-eighth filler cells F21 to F28, one of the first and second active lines ACT_1 and ACT_2 may have a constant width in the second horizontal direction (Y), and the other may have the width-changing portion VA1 or the width-changing portion VA2 adjacent to one of the first and second line patterns GL_D1 and GL_D2.

Referring back to FIGS. 5B to 5G, in the fifth to twenty-eighth filler cells F5 to F28, at least one of the first and second active lines ACT_1 and ACT_2 may have a different width in the second horizontal direction (Y). The active lines having different widths in the second horizontal direction (Y) may include a relatively wide dummy portion and a relatively narrow dummy portion. The former, i.e., the dummy portion having a relatively large width, may be configured to protrude farther in a direction of a middle portion between the first and second power wirings M1 (VDD and VSS) than the latter, i.e., the dummy portion having a relatively small width.

Figure 5H:
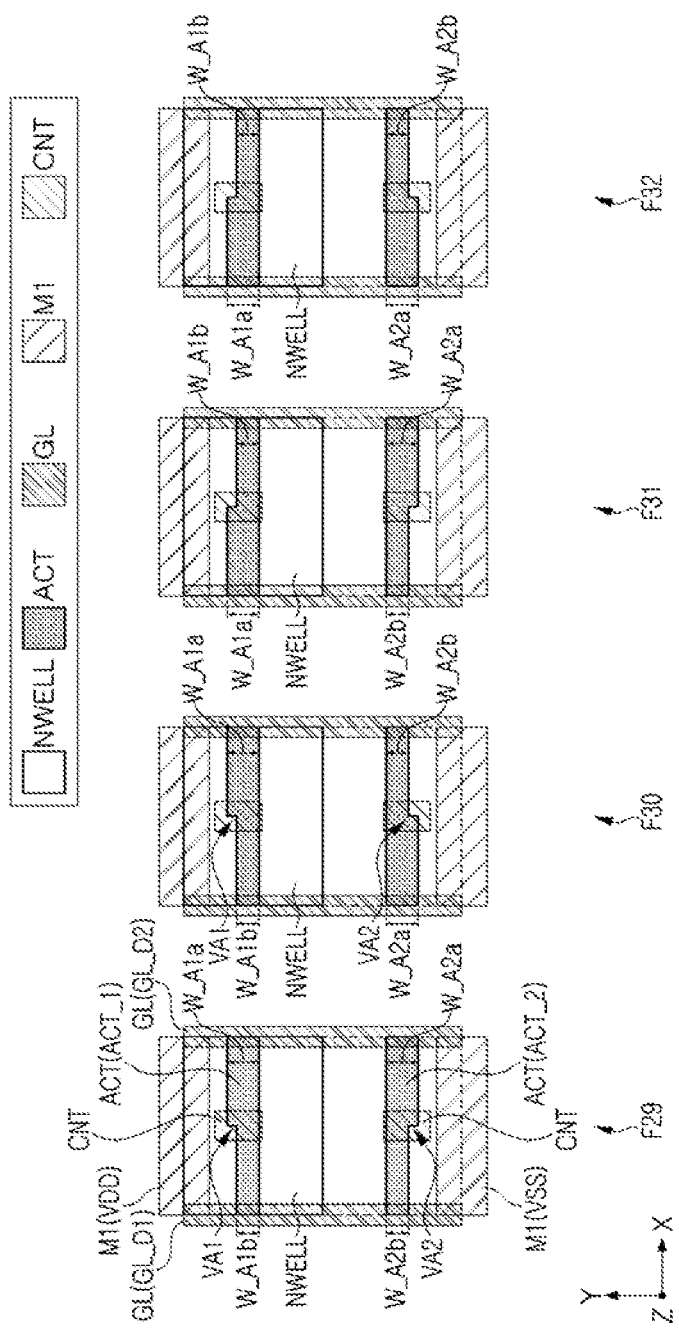
Figure 5I:
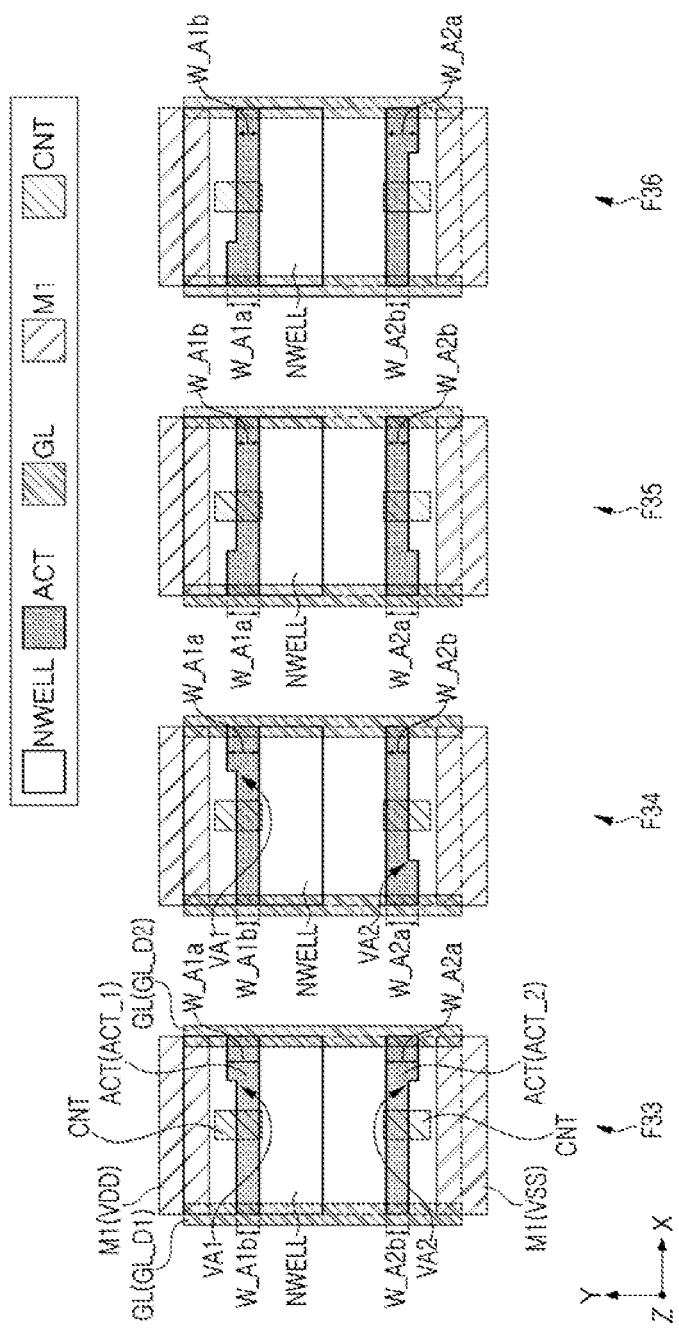

In another modified example (described below with reference to FIGS. 5H and 5I illustrating a portion of the modified examples of the fifth to twenty-eighth filler cells F5 to F28), in the fifth to twenty-eighth filler cells F5 to F28, at least one of the first and second active lines ACT_1 and ACT_2 may have different widths in the second horizontal direction (Y), and a dummy portion (having a relatively wide portion and a relatively narrow portion in the second horizontal direction (Y)) may be configured so that the relatively wide portion protrudes away from the middle portion between the first and second power wirings M1 (VDD and VSS) as compared to the relatively narrow portion. The modified examples may be understood based on the fifth to twenty-eighth filler cells F5 to F28, but to further understand the modified examples, an example embodiment will be described with reference to FIGS. 5H and 5I illustrating a portion of the modified examples of the fifth to twenty-eighth filler cells F5 to F28.

Referring to FIGS. 5H and 5I, twenty ninth to thirty sixth filler cells F29 to F36 are modified examples of the fifth to twelfth filler cells F5 to F12, respectively. For example, in the twenty ninth filler cell F29, the dummy portion having a relatively large width in the fifth filler cell F5 (in FIG. 5B) may be configured to protrude farther than the dummy portion having a relatively small width W_A1a and W_A2a (in FIG. 5B) in a direction of being spaced apart from the middle portion between the first and second power wirings M1 (VDD, VSS).

Figure 5J:
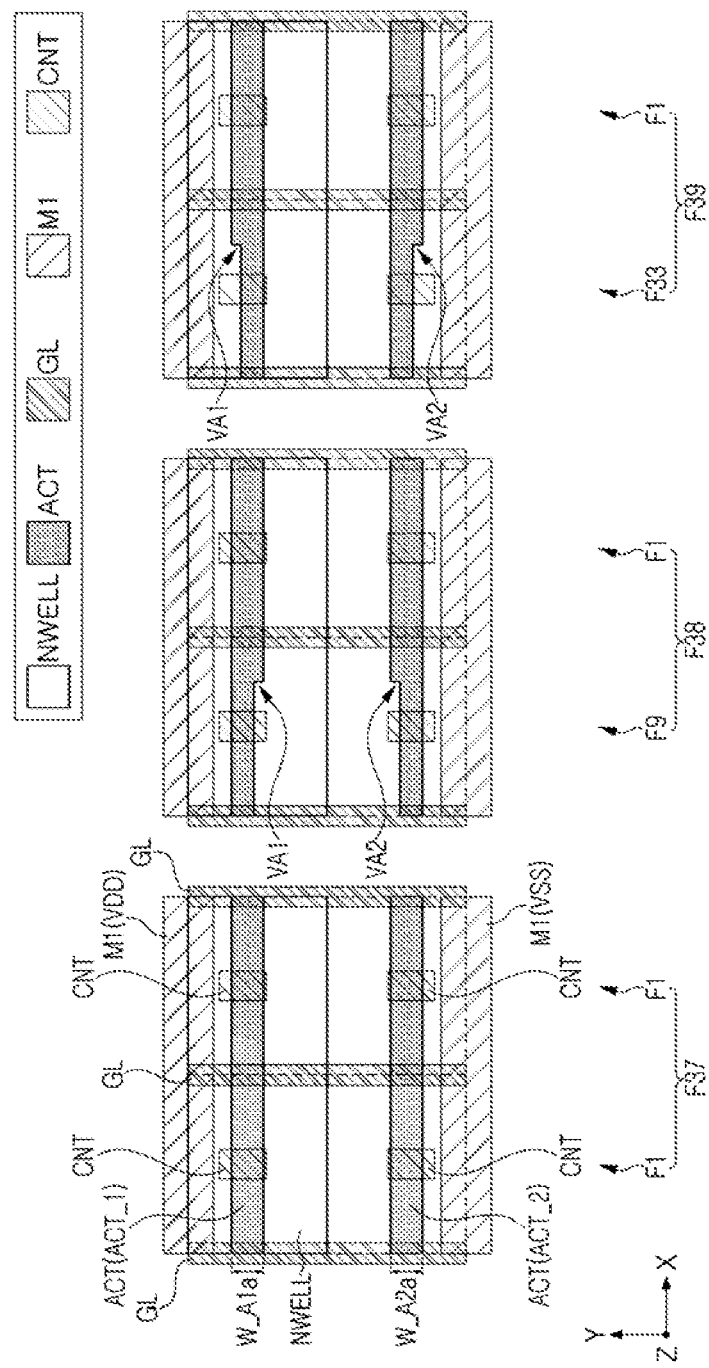

The first to thirty sixth filler cells F29 to F36 described with reference to FIGS. 5A to 5I may include a pair of first and second line patterns GL (GL_D1, GL_D2) adjacent to each other. However, an example embodiment may include filler cells formed by combining the first to thirty sixth filler cells F29 to F36. For example, an example embodiment may include a first combined filler cell formed by combining the same filler cells of the first to thirty sixth filler cells F29 to F36, and a second combined filler cell formed by combining different filler cells of the first to thirty sixth filler cells F29 to F36. The example of the first and second combined cells will be described with reference to FIG. 5J. FIG. 5J illustrates an example of the combined cell, and various other combined cells which are not described in FIG. 5J may be included in the example embodiment.

Referring to FIG. 5J, a thirty seventh filler cell F37 may be formed by combining the above-described same first filler cells F1 in the first horizontal direction (X). The thirty eighth filler cell F38 may be formed by combining the ninth filler cell F9 with the first filler cell F1 in the first horizontal direction (X). The thirty ninth filler cell F39 may be formed by combining the thirty third filler cell F33 with the first filler cell F1 in the first horizontal direction (X).

In an example embodiment, in the forming of the reference filler cells (S30) described in the example embodiment illustrated in FIG. 1, the reference filler cell may be configured as one of the first and second filler cells F1 and F2. For example, the first filler cell F1 may be formed as the reference filler cell.

In another example, when a width of each of the filler cell regions FC is greater than a width of the first filler cell F1 in the first horizontal direction (X), the thirty seventh filler cell F37 (formed by combining a plurality of the first filler cells F1 in the first horizontal direction (X)) may be formed as the reference filler cell.

In the description below, the forming of the layout (S20a) described in the example embodiment illustrated in FIG. 1 will be described.

Figure 6:
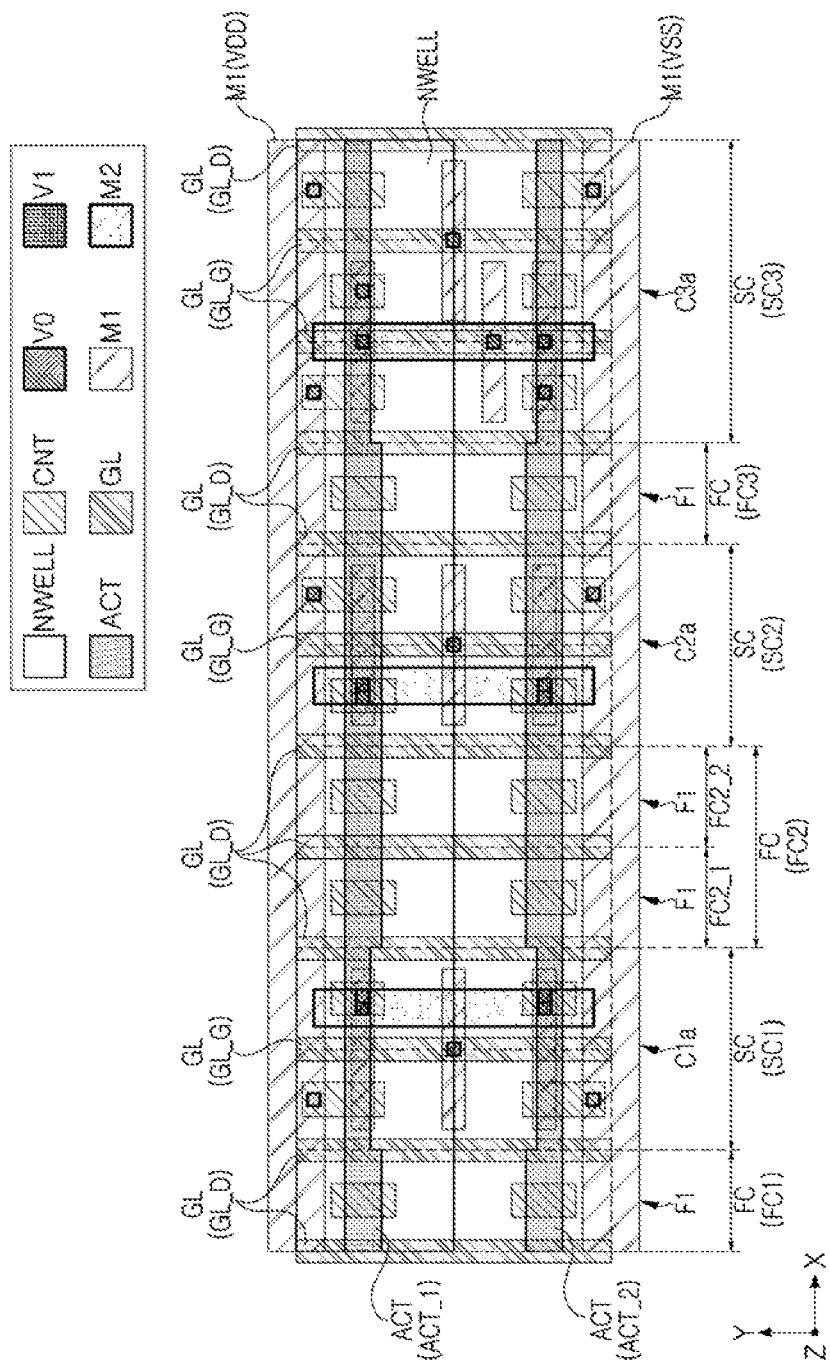
FIGS. 6 and 7 are plan diagrams illustrating a method for forming a layout of a semiconductor device according to an example embodiment.
Figure 7:
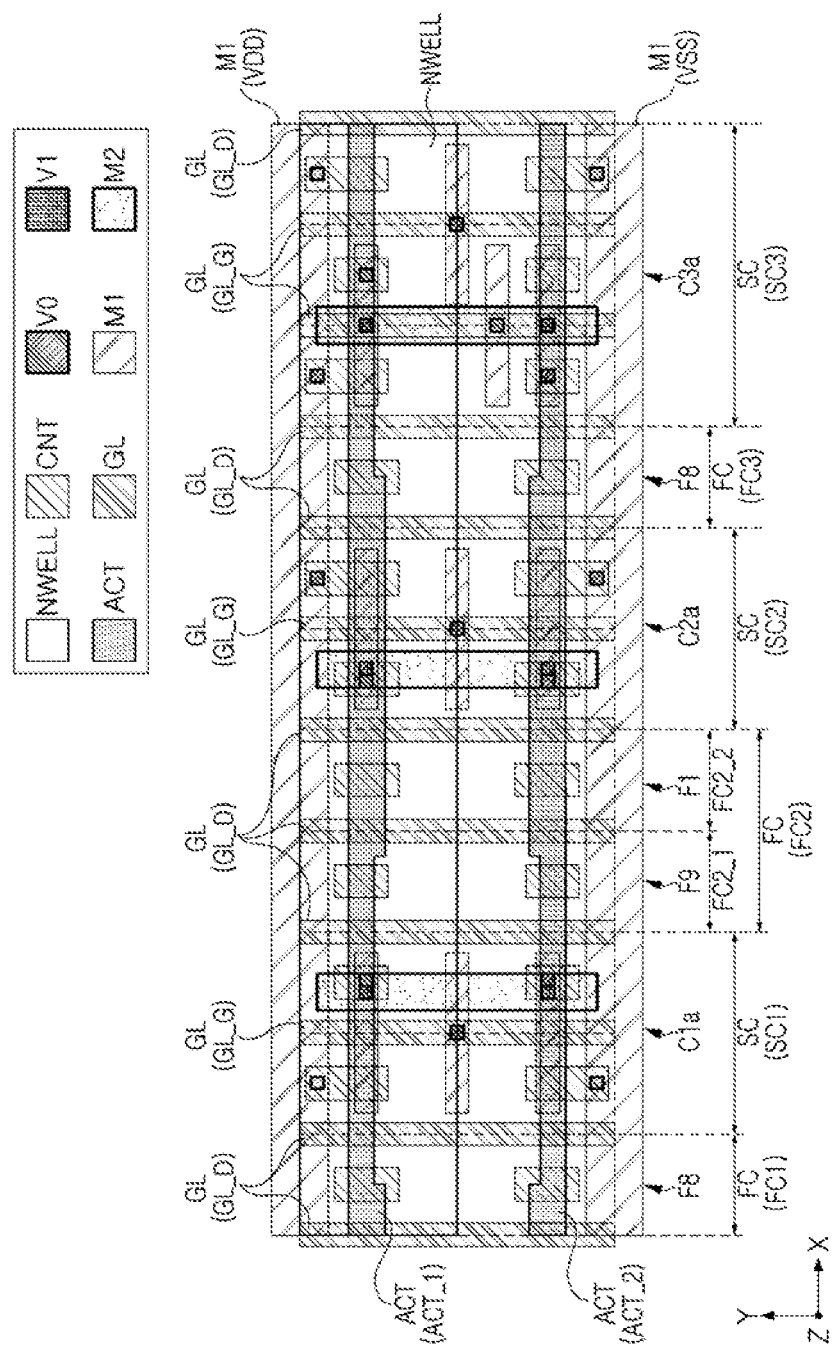

FIGS. 6 and 7 are plan diagrams illustrating a method for forming a layout of a semiconductor device according to an example embodiment.

In the description below, the method of forming the layout using the first filler cell F1 as the reference filler cell will be described, although, for example, the thirty seventh filler cell F37 may be used as the reference filler cell depending on a size of the filler cell region.

Referring to FIG. 6, a plurality of standard cells C1a, C2a, and C3a may be formed. Regions in which the standard cells C1a, C2a, and C3a are disposed may be defined as standard cell regions SC. The first standard cell region SC1 may be a region in which the first standard cell C1a is disposed, the second standard cell region SC2 may be a region in which the second standard cell C2a is disposed, and the third standard cell region SC3 may be a region in which the third standard cell C3a is disposed. A plurality of standard cell regions SC may correspond to the first to third standard cell regions SC1 to SC3 described in FIG. 3A.

In an example embodiment, the first and second standard cells C1a and C2a may be configured as inverter standard cells, and the third standard cell C3a may be configured as a NAND standard cell.

Reference filler cells F1 may be formed in regions where the first to third standard cells C1a, C2a, and C3a are not formed. A region in which the reference filler cells F1 are formed may be configured as filler cell regions FC. The filler cell regions FC may include a first filler cell region FC1 in which a single filler cell is disposed, a second filler cell region FC2 in which a plurality of filler cells are disposed, and a third filler cell region FC3 in which a single filler cell is disposed. The second filler cell region FC2 may include a filler cell region FC2_1 in which a single filler cell is disposed, and a filler cell region FC2_2 in which a single filler cell is disposed.

A single reference filler cell F1 or a plurality of reference filler cells F1 may be disposed between adjacent standard cells depending on a gap or a spacing distance among the first to third standard cells C1a, C2a, and C3a. The plurality of reference filler cells F1 may be replaced with the thirty seventh filler cell F37.

In the layout illustrated in FIG. 6, the routing of the first to third standard cells C1a, C2a, and C3a may be completed. For example, the first to third standard cells C1a, C2a, and C3a may be formed up to the plurality of contact plugs CNT, the plurality of lower wirings M1, the plurality of lower vias V0, the plurality of upper vias V1, and the upper wiring M2, which are described in the aforementioned example embodiment. Also, a layout in which the first to third standard cells C1a, C2a, and C3a and the reference filler cells F1 are disposed may include the line patterns GL described in the aforementioned example embodiment. The line patterns GL may include gate lines GL_G and dummy lines GL_D. The gate lines GL_G may be included in standard cells, respectively, and the dummy lines GL_D may be included in the reference filler cells F1, respectively. Also, the dummy lines GL_D may be disposed on both sides of each of the respective first to third standard cells C1a, C2a, and C3a.

Referring to FIG. 7, the operation of analyzing a pattern (S35) illustrated in FIG. 1 and the operation of selecting unsuitable filler cells of the reference filler cells (each of which has a pattern having continuity with a pattern of an adjacent standard cell) (S40) may be performed. For example, the analyzing a pattern (S35) (in FIG. 1) may include obtaining information on a width of each of the active lines ACT_1 and ACT_2 of the first to third standard cells C1a, C2a, and C3a in the second horizontal direction (Y).

In the selecting unsuitable filler cells of the reference filler cells, each of which has a pattern having continuity with a pattern of an adjacent standard cell (S40), the width of each of the active lines ACT_1 and ACT_2 of the first to third standard cells C1a, C2a, and C3a in the second horizontal direction (Y) may be compared with the width of each of the active lines ACT_1 and ACT_2 of the reference filler cell F1 (in FIG. 6) in the second horizontal direction (Y). When the width of each of the active lines ACT_1 and ACT_2 of the first to third standard cells C1a, C2a, and C3a is the same as the width of each of the active lines ACT_1 and ACT_2 of the reference filler cell F1 (in FIG. 6), the filler cell may be recognized as having a pattern with continuity, and the reference filler cell F1 may be selected as a suitable filler cell. When the width of each of the active lines ACT_1 and ACT_2 of the first to third standard cells C1a, C2a, and C3a in the second horizontal direction (Y) is different from the width of each of the active lines ACT_1 and ACT_2 of the reference filler cell F1 (in FIG. 6) in the second horizontal direction (Y), the reference filler cell F1 (in FIG. 6) may be selected as an unsuitable filler cell.

The replacing the unsuitable filler cells with new filler cells having patterns with continuity with patterns of the adjacent standard cells (S45) (in FIG. 1) may include replacing the unsuitable filler cells with an appropriate filler cell of the second to thirty sixth filler cells F5 to F36 illustrated in FIGS. 5A to 5I. For example, in the filler cell region FC1, the reference filler cell F1 (in FIG. 6) may be replaced with the eighth filler cell F8, in the filler cell region FC2_1, the reference filler cell F1 (in FIG. 6) may be replaced with the ninth filler cell F9, in the filler cell region FC2_2, the reference filler cell F1 (in FIG. 6) may be selected as a suitable filler cell and may remain, and in the filler cell region FC3, the reference filler cell F1 (in FIG. 6) may be replaced with the eighth filler cell F8.

In another example embodiment, in the filler cell region FC2_1, the reference filler cell F1 (in FIG. 6) may be replaced with the ninth filler cell F9 (in FIG. 7), and while the reference filler cell F1 (in FIG. 6) may be selected as a suitable filler cell and may remain, the filler cell FC2 including the filler cell FC2_1 and the filler cell FC2_2 may be replaced with the combined filler cell F38 (in FIG. 5J).

In another example embodiment, the layout may be formed by the same method described in the example embodiment illustrated in FIG. 2. For example, the forming of the reference filler cells F1 (S30) (in FIG. 1) may not be performed, and the forming a plurality of standard cells (S25) (in FIG. 2) may be performed. Thereafter, the operation of analyzing a pattern (S36) (in FIG. 2) for obtaining information on a width of each of the active lines ACT_1 and ACT_2 of the first to third standard cells C1a, C2a, and C3a may be performed, and the forming filler cells having active lines having continuity with the active lines ACT of the first to third standard cells C1a, C2a, and C3a in a region in which the first to third standard cells C1a, C2a, and C3a are not formed (S50) may be performed. The filler cells may be formed using the first to thirty ninth filler cells F1 to F39 illustrated in FIGS. 5A to 5F.

In the description below, the semiconductor device formed using the layout illustrated in FIG. 7 will be described.

Figure 8A:
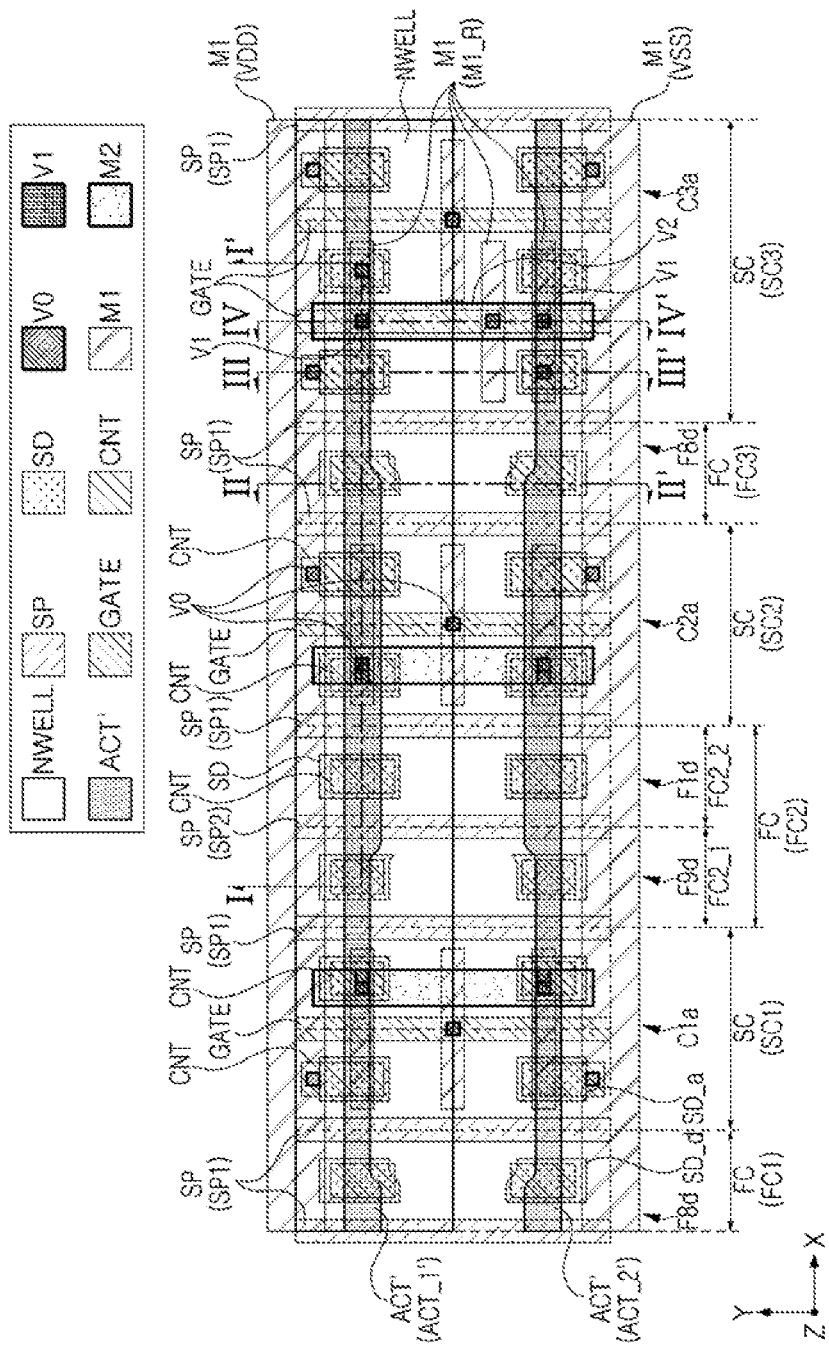
FIGS. 8A to 8C are plan diagrams illustrating a semiconductor device manufactured using the layout illustrated in FIG. 7.
Figure 8B:
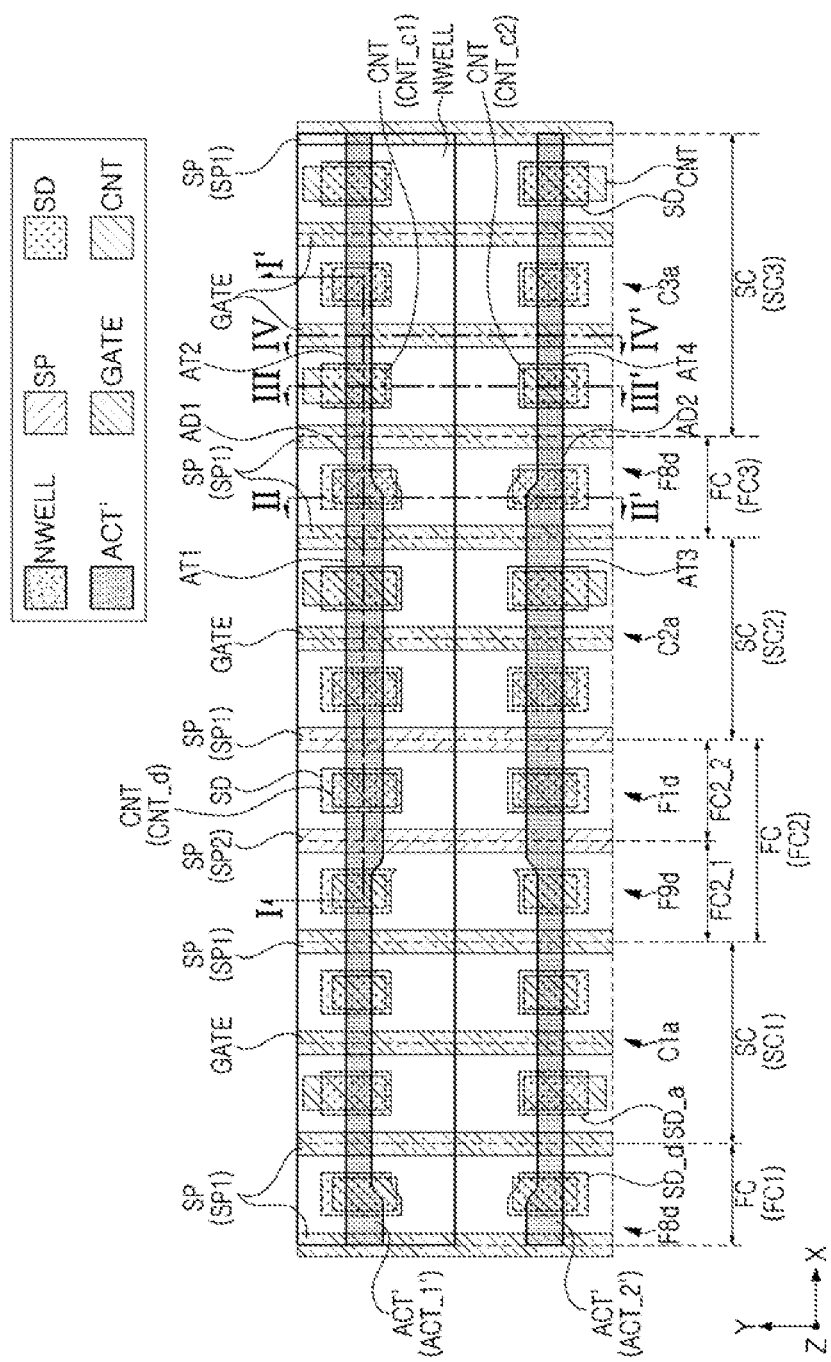
Figure 8C:
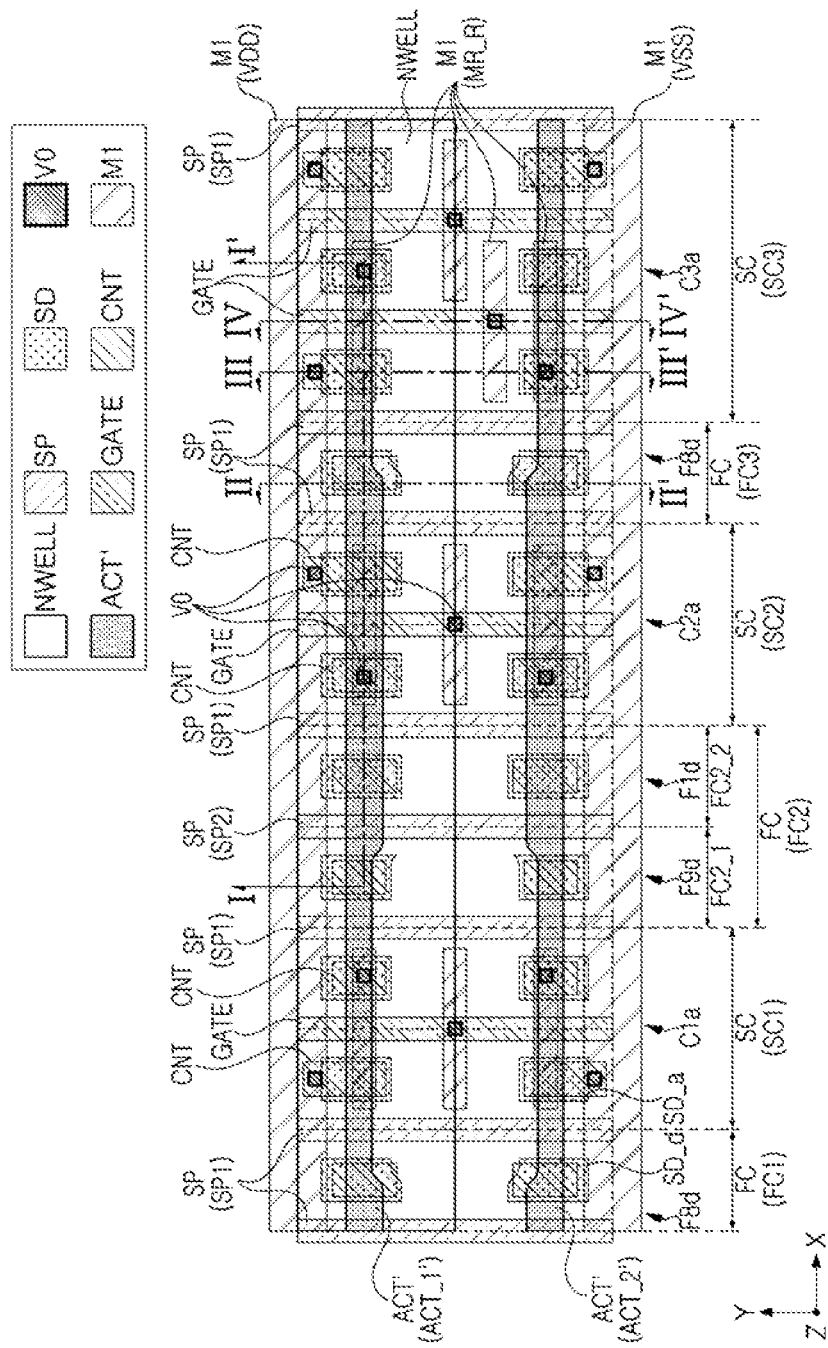
Figure 9:
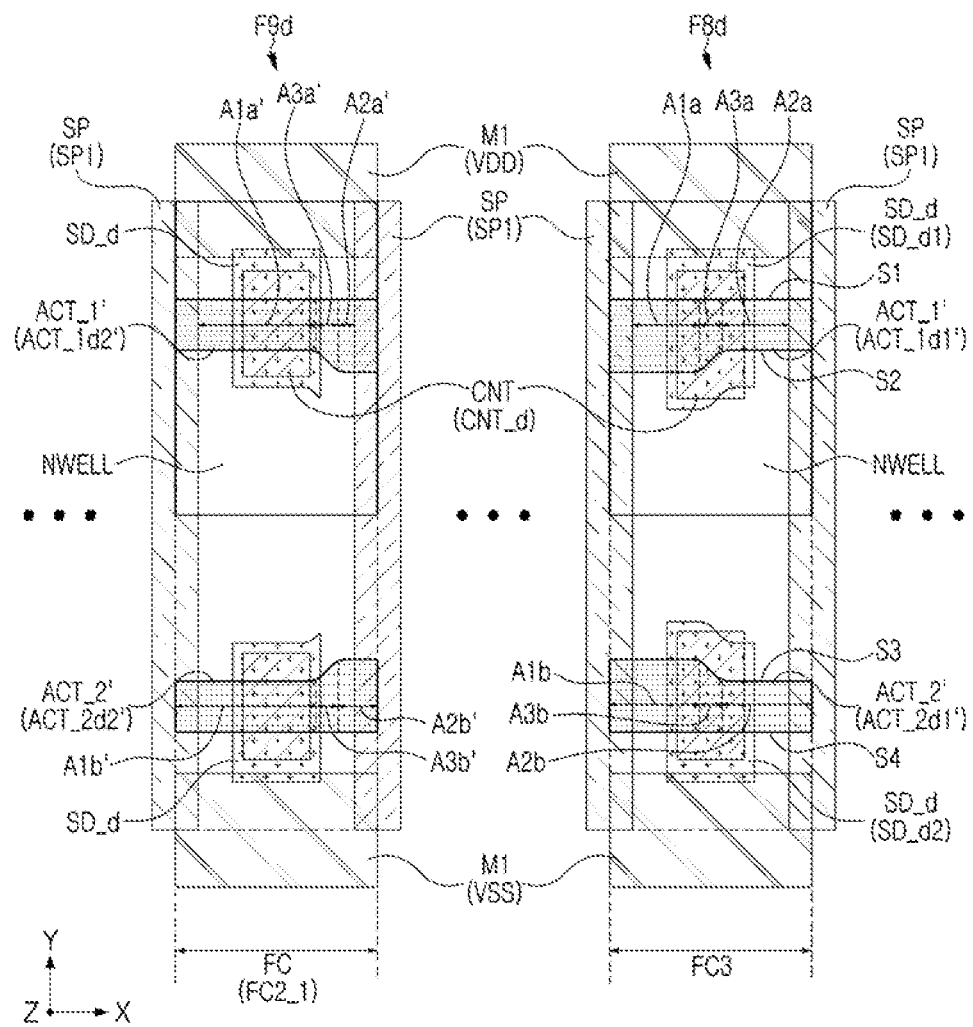
FIG. 9 is an enlarged diagram illustrating a portion of the semiconductor device illustrated in FIG. 8C.
Figure 10A:
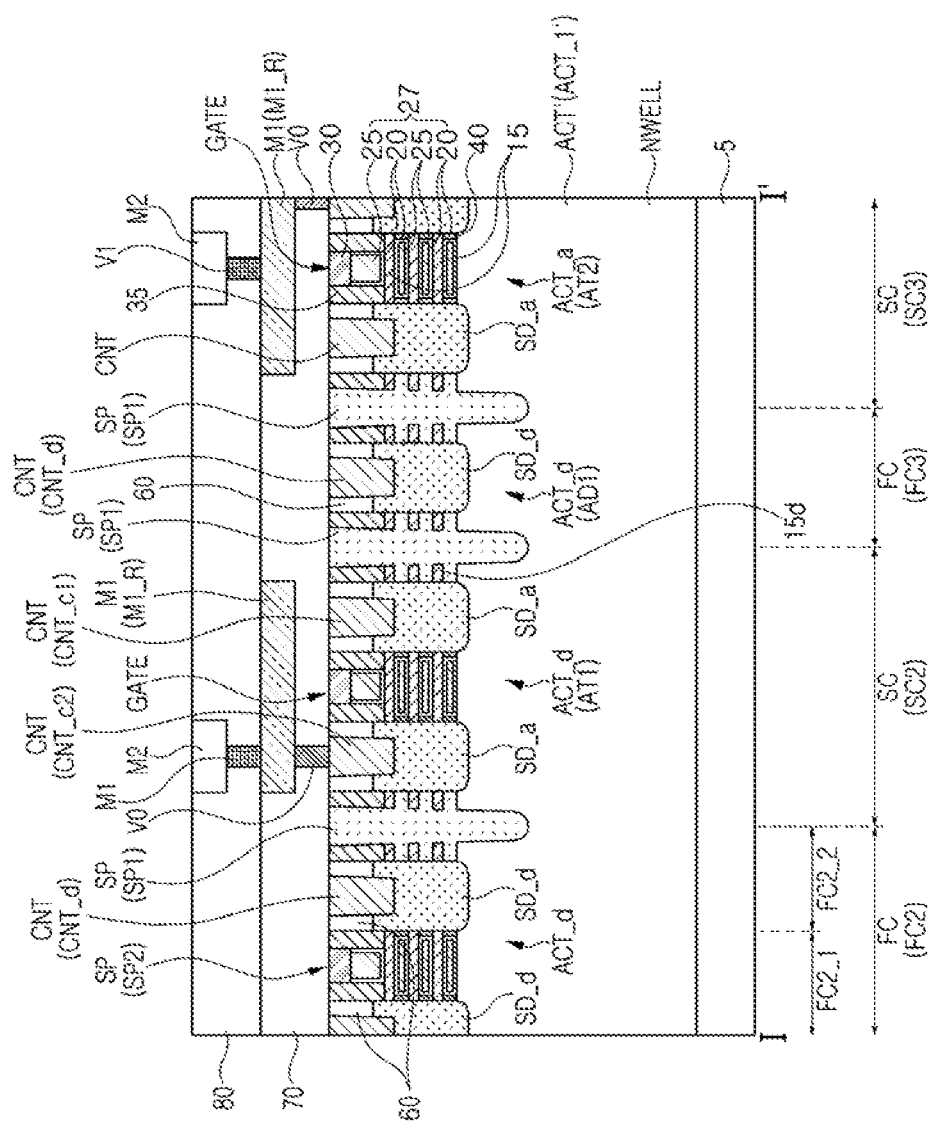
FIGS. 10A to 10C are cross-sectional diagrams illustrating a semiconductor device according to an example embodiment.
Figure 10B:
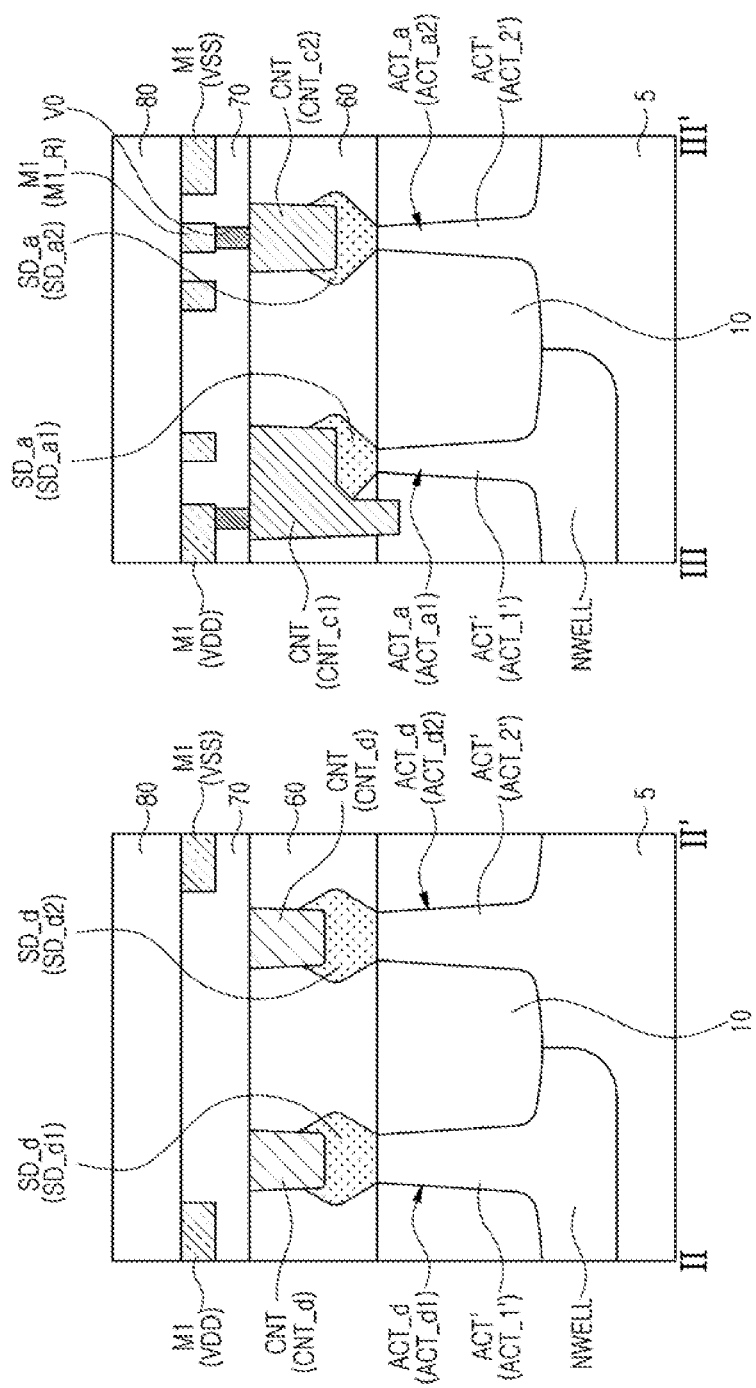
Figure 10C:
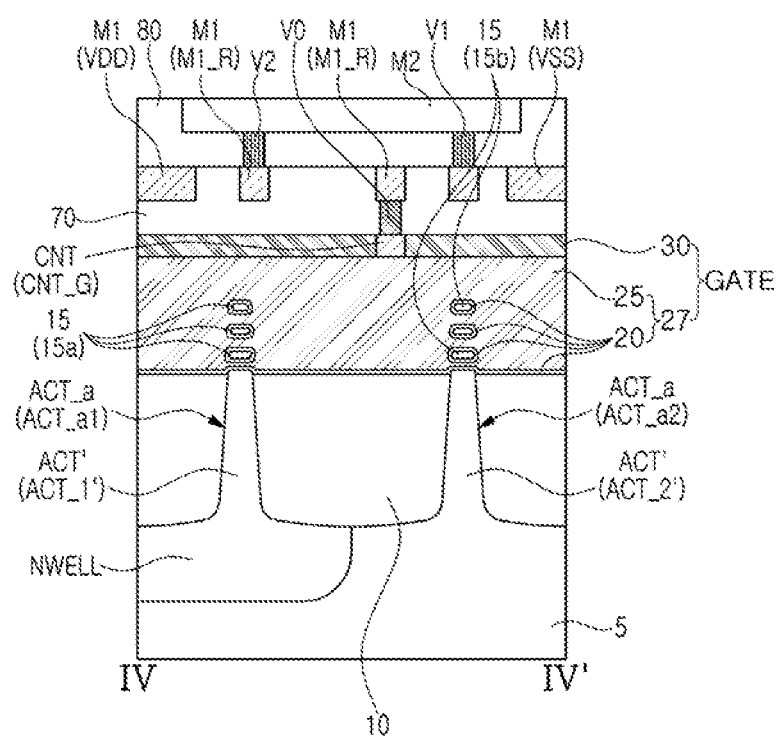

FIGS. 8A to 8C are plan diagrams illustrating a semiconductor device manufactured using the layout illustrated in FIG. 7. FIG. 9 is an enlarged diagram illustrating a portion of the semiconductor device illustrated in FIG. 8C. FIGS. 10A to 10C are cross-sectional diagrams illustrating a semiconductor device according to an example embodiment. In FIGS. 10A to 10C, FIG. 10A is a cross-sectional diagram taken along line I-I' in FIG. 8A, FIG. 10B is cross-sectional diagrams taken along lines II-IF and in FIG. 8A, and FIG. 10C is a cross-sectional diagram taken along line IV-IV' in FIG. 8A.

In FIGS. 8A to 8C, FIG. 8B is a plan diagram illustrating a portion of the elements illustrated in FIG. 8A, FIG. 8C is a plan diagram illustrating the example illustrated in FIG. 8B which further includes a portion of the elements illustrated in FIG. 8A. FIGS. 8A to 8C are plan diagrams illustrating the example formed according to the layout illustrated in FIG. 7. Accordingly, the elements of the layout illustrated in FIG. 7 may be reflected to the plan diagrams illustrated in FIGS. 8A to 8C. In the description below, in the description of the semiconductor device according to an example embodiment, among the elements of the layout illustrated in FIG. 7, the elements changed while a process of manufacturing a semiconductor device is performed and the elements which have not been reflected in the layout illustrated in FIG. 7 will mainly be described. Thus, among the elements illustrated in FIG. 7, the elements for which a planar shape has not changed may be directly referred to without repeating detailed descriptions thereof, or the descriptions of the elements may be briefly described.

Referring to FIGS. 8A to 8C, the first to third standard cells C1a, C2a, and C3a and the filler cells F8, F9, and F1 may be reflected and formed in the semiconductor device by the process of manufacturing a semiconductor device (S80) (in FIGS. 1 and 2). For example, the filler cells F8, F9, and F1 in the layout illustrated in FIG. 7 may be formed as dummy cells F8d, F9d, and F1d by the process of manufacturing a semiconductor device (S80) (in FIGS. 1 and 2). The plurality of contact plugs CNT, the plurality of lower wirings M1, the plurality of lower vias V0, the plurality of upper vias V1, and the upper wiring M2 may be disposed substantially the same as in the layout illustrated in FIG. 7. Active lines ACT' to which the active lines ACT included in the layout illustrated in FIG. 7 are reflected may be disposed, and line patterns SP and GATE to which the line patterns GL are reflected may be disposed. The line patterns SP and GATE may include dummy lines SP corresponding to the dummy lines GL_D included in the layout illustrated in FIG. 7 and gate lines GATE corresponding to the gate lines GL_G included in the layout illustrated in FIG. 7.

In an example embodiment, the dummy lines SP may include first dummy lines SP1 adjacent to the standard cells and a second dummy line SP2 disposed between the first dummy lines SP1 adjacent to each other.

In the filler cell regions FC, dummy source/drain regions SD_d may be disposed on the active lines ACT'. In the standard cell regions SC, circuit source/drain regions SD_a may be disposed on the active lines ACT'. Each of the circuit source/drain regions SD_a may have a symmetrical structure.

A portion of the dummy source/drain regions SD_d may have an asymmetrical structure. For example, a dummy cell F8d (corresponding to the eighth filler cell F8 (in FIG. 7) formed in the filler cell region FC1 and the filler cell region FC3 described in FIG. 7) and a dummy cell F9d (corresponding to the ninth filler cell F9 (in FIG. 7) formed in the filler cell region FC2_1 described in FIG. 7) may have an asymmetrical structure. For example, each of side surfaces of the source/drain regions SD_d of the dummy cells F8d and F9d may have an asymmetrical structure in the second horizontal direction (Y).

In a semiconductor device, the plurality of standard cell regions SC in the layout illustrated in FIG. 7 may be referred to as circuit regions, and the filler cell regions FC may be referred to as dummy regions. The standard cell regions SC may include a first circuit region SC2 and a second circuit region SC3 disposed in the first horizontal direction (X), and the dummy regions FC may include a first dummy region FC3 disposed between the first circuit region SC2 and the second circuit region SC3.

The active lines ACT' may include a first active line ACT_1' and a second active line ACT_2' extending in the first horizontal direction (X) and crossing the first circuit region SC2, the dummy region FC3, and the second circuit region SC3. The first active line ACT_1' and the second active line ACT_2' may oppose each other. The first active line ACT_1' may be disposed in a N-well region NWELL. The first active line ACT_1' disposed in the N-well region NWELL may have N-type conductivity, and the second active line ACT_2' which is not disposed in the N-well region NWELL may have P-type conductivity.

The first active line ACT_1' may include a first circuit active portion AT1 (in FIG. 8B) disposed in the first circuit region SC2, a dummy active portion AD1 (in FIG. 8B) disposed in the dummy region FC3, and a second circuit active portion AT2 (in FIG. 8B) disposed in the second circuit region SC3. The second active line ACT_2' may include a third circuit active region AT3 (in FIG. 8B) disposed in the first circuit region SC2, a second dummy active portion AD2 (in FIG. 8B) disposed in the dummy region FC3, and a fourth circuit active portion AT4 (in FIG. 8B) disposed in the second circuit region SC3. The dummy active portion AD1 (in FIG. 8B) and the second dummy active portion AD2 (in FIG. 8B) may be disposed between a pair of dummy lines SP1 adjacent to each other.

The first circuit active portion AT1 may have a first width in the second horizontal direction (Y). The second circuit active portion AT2 may have a second width smaller than the first width in the second horizontal direction (Y). The dummy active portion AD1 (in FIG. 8B) may have a first width portion having a width the same as the first width, a second width portion having a width the same as the second width, and a first width-changing portion disposed between the first width portion and the second width portion. The first width-changing portion may be disposed between the pair of dummy lines SP1. The first width-changing portion will be described with reference to FIG. 9.

The dummy cells F8d and F9d will be described with reference to FIG. 9. The dummy cell F8d of the dummy cells F8d and F9d, disposed in the filler cell region FC1 and the filler cell region FC3, will be referred to as a first dummy cell. The dummy cell F9d disposed in the filler cell region FC2_1 will be referred to as a second dummy cell.

Referring to FIG. 9, in the active lines ACT', the first active line ACT_1' disposed in the dummy cell F8d may be defined as a first dummy active region ACT_1d1'. The second active line ACT_2' disposed in the dummy cell F8d may be defined as a second dummy active region ACT_2d1'.

In an example embodiment, the first dummy active region ACT_1d1' may also be referred to as the dummy active portion AD1. The second dummy active region ACT_2d1' may be referred to as the second dummy active portion AD2.

In the dummy cell F8d, the first dummy active region ACT_1d1' may include a first width portion A1a having a first width in the second horizontal direction (Y), a second width portion A2a having a second width greater than the first width in the second horizontal direction (Y), and a first width-changing portion A3a disposed between the first width portion A1a and the second width portion A2a. The second dummy active region ACT_2d1' may include a third width portion A1b having the first width, a fourth width portion A2b having the second width, and a second width-changing portion A3b disposed between the third width portion A1b and the fourth width portion A2b.

In the first dummy cell F8d, lengths of the first width portion A1a and the second width portion A2a in the first horizontal direction (X) may be substantially the same. Accordingly, the first width-changing portion A3a may be disposed in a middle portion between line patterns SP adjacent to each other. In the dummy cell F8d, lengths of the third width portion A1b and the fourth width portion A2b in the first horizontal direction (X) may be substantially the same. Accordingly, the second width-changing portion A3b may be disposed in a middle portion disposed between line patterns SP adjacent to each other.

In the active lines ACT', the first active line ACT_1' disposed in the dummy cell F9d may be defined as a third dummy active region ACT_1d2'. The second active line ACT_2' disposed in the dummy cell F9d may be defined as a fourth dummy active region ACT_2d2'.

In the second dummy cell F9d, the third dummy active region ACT_1d2' may include a fifth width portion A1a' having the second width, a sixth width portion A2a' having the first width, and a third width-changing portion A3a' disposed between the fifth width portion A1a' and the sixth width portion A2a'. The fourth dummy active region ACT_2d2' may include a seventh width portion A1b' having the second width, an eighth width portion A2b' having the first width, and a fourth width-changing portion A3b' disposed between the seventh width portion A1b' and the eighth width portion A2b'.

In the second dummy cell F9d, a length of the fifth width portion A1a' in the first horizontal direction (X) may be greater than a length of the sixth width portion A2a' in the first horizontal direction (X). Accordingly, in the second dummy cell F9d, the third width-changing portion A3a' may be adjacent to one of the line patterns SP adjacent to each other. In the second dummy cell F9d, a length of the seventh width portion A1b' in the first horizontal direction (X) may be greater than a length of the eighth width portion A2b' in the first horizontal direction (X). Accordingly, in the second dummy cell F9d, the fourth width-changing portion A3b' may be adjacent to one of the line patterns adjacent to each other.

The first dummy active region ACT_1d1' may have a first dummy active side surface S1 and a second dummy active side surface S2 opposing each other. The second dummy active region ACT_2d1' may have a third dummy active side surface S3 and a fourth dummy active side surface S4 opposing each other. The second dummy active side surface S2 and the third dummy active side surface S3 may oppose each other.

Each of the first dummy active side surface S1 of the first dummy active region ACT_1d1' and the fourth dummy active side surface S4 of the second dummy active region ACT_2d1' may have a straight linear line shape in plan view.

The second dummy active side surface S2 of the first dummy active region ACT_1d1' may have a bent portion in plan view. The third dummy active side surface S3 of the second dummy active region ACT_2d1' may have a bent portion in plan view.

The dummy source/drain regions SD_d may include a first dummy source/drain region SD_d1 on the first dummy active region ACT_1d1' and a second dummy source/drain region SD_d2 on the second dummy active region ACT_2d1'. Each of the first and second dummy source/drain regions SD_d1 and SD_d2 may have an asymmetrical structure.

In an example embodiment, the dummy cell described with reference to FIGS. 8C and 9 (the first and second dummy cells F8d and F9d) may be replaced with various other dummy cells in accordance with a size and a shape of each of the circuit regions and the dummy regions and arrangement of the circuit regions and the dummy regions. For example, the first and second dummy cells F8d and F9d may be replaced with dummy cells formed using the first to thirty ninth filler cells F1 to F39 described with reference to FIGS. 5A to 5F. Thus, the semiconductor device in the example embodiment may include the dummy cells formed using the first to thirty ninth filler cells F1 to F39.

FIGS. 10A to 10C are cross-sectional diagrams illustrating a semiconductor device according to an example embodiment. FIG. 10A is a cross-sectional diagram taken along line I-I' in FIG. 8A, FIG. 10B is a cross-sectional diagram taken along lines II-IF and in FIG. 8A, and FIG. 10C is a cross-sectional diagram taken along line IV-IV' in FIG. 8A.

Referring to FIGS. 10A to 10C along with FIGS. 8A to 8C, the active lines ACT' may be disposed on a semiconductor substrate 5. The active lines ACT' may include a first active line ACT_1' disposed in a N-well region NWELL. The active lines ACT' may include a second active line ACT_2' not disposed in the N-well region NWELL and opposing the first active line ACT_1'.

An isolation layer 10 for limiting the active lines ACT' may be disposed on the semiconductor substrate 5. The isolation layer 10 may be formed of an insulating material such as silicon oxide.

Among the active lines ACT', active lines ACT' disposed in circuit regions SC may be defined as circuit active regions ACT_a, and active lines ACT' disposed in a filler cell region FC may be defined as dummy active regions ACT_d.

Circuit source/drain regions SD_a may be disposed on the circuit active regions ACT_a, and dummy source/drain regions SD_d may be disposed on the dummy active regions ACT_d.

The dummy source/drain regions SD_d may include a first dummy source/drain region SD_d1 and a second dummy source/drain region SD_d2 described in the example embodiment illustrated in FIG. 9. The circuit active regions ACT_a may include a first circuit active region ACT_a1 and a second circuit active region ACT_a2. The first circuit active region ACT_a1 may be disposed on the first active line ACT_1', and the second circuit active region ACT_a2 may be disposed on the second active line ACT_2'.

The circuit source/drain regions SD_a may include a first circuit source/drain region SD_a1 on the first circuit active region ACT_a1 and a second circuit source/drain region SD_a2 on the second circuit active region ACT_a2.

A gate line GATE of a plurality of line patterns SP and GATE may include a gate 27 and an insulating capping layer 30 on the gate 27. The gate 27 may include a gate dielectric 20 and a gate electrode 25 on the gate dielectric 20. The gate dielectric 20 may include a silicon oxide and/or a high-k dielectric. The gate electrode 25 may include a doped silicon, a metal nitride (e.g., TiN, TaN, TiSiN, WN, or the like) and/or a metal (e.g., Ti, Ta, W, or the like).

A plurality of semiconductor layers 15 stacked in a vertical direction perpendicular to an upper surface of the semiconductor substrate 5 and spaced apart from each other may be disposed on the circuit active regions ACT_a. The plurality of semiconductor layers 15 may include a plurality of first semiconductor layers 15a on the first circuit active region ACT_a1 and a plurality of second semiconductor layers 15b on the second circuit active region ACT_a2. The gates 27 may overlap the plurality of semiconductor layers 15 and may cover an upper and lower surfaces of the plurality of semiconductor layers 15. In an example embodiment, the plurality of semiconductor layers 15 may be formed of a semiconductor material (e.g., silicon, or the like).

The plurality of semiconductor layers 15 may be disposed between the circuit source/drain regions SD_a adjacent to each other. The plurality of semiconductor layers 15 may be electrically connected to the circuit source/drain regions SD_a adjacent to each other.

In an example embodiment, internal spacers 40 may be disposed between the circuit source/drain regions SD_a and the gate 27. The internal spacers 40 may be formed of an insulating material such as silicon oxide. In another example embodiment, the internal spacers 40 may be omitted.

In an example embodiment, gate spacers 35 covering side surfaces of the gate 27 and the insulating capping layer 30 may be disposed on the plurality of semiconductor layers 15.

The first dummy lines SP1 of the plurality of line patterns SP and GATE may extend into the active lines ACT' from an upper portion of the active lines ACT'. The first dummy lines SP1 may electrically separate the circuit source/drain regions SD_a and the dummy source/drain regions SD_d, adjacent to each other, from each other. The first dummy lines SP1 may be formed of an insulating material such as silicon oxide and/or silicon nitride.

In an example embodiment, each of the second dummy lines SP2 of the plurality of line patterns SP and GATE may have a structure the same as a structure of the gate lines GATE. Accordingly, the first dummy lines SP1 may be formed of an insulating material. The second dummy lines SP2 may include a conductive material the same as a conductive material of the gate electrode 25 of the gate lines GATE. The second dummy lines SP2 may include a material different from a material of the first dummy lines SP1.

In another example embodiment, the second dummy lines SP2 may be configured to have a structure the same as a structure of the first dummy lines SP1. Accordingly, the first and second dummy lines SP1 and SP2 may be formed of the same material.

An interlayer insulting layer 60 covering the dummy and circuit source/drains SD_d and SD_a may be disposed on the isolation layer 10. The interlayer insulting layer 60 may cover an overall upper surface of each of the dummy source/drain regions SD_d.

Contact plugs CNT may be disposed. The contact plugs CNT may be formed of a conductive material. The contact plugs CNT may include circuit source/drain contact plugs CNT_c1 and CNT_c2 in contact with and electrically connected to the circuit source/drain regions SD_a on the circuit source/drain regions SD_a, and a gate contact plug CNT_G in contact with and electrically connected to the gate electrode 25 on the gate electrode 25.

In an example embodiment, the circuit source/drain contact plugs CNT_c1 and CNT_c2 may include the first source/drain contact plug CNT_c1 and the second source/drain contact plug CNT_c2 having different lengths in the second horizontal direction (Y).

A plug of the circuit source/drain contact plugs CNT_c1 and CNT_c2 having a relatively great length in the second horizontal direction (Y) may be defined as a first source/drain contact plug CNT_c1. A plug having a relatively short length in the second horizontal direction (Y) may be defined as a second source/drain contact plug CNT_c2. Accordingly, a length of the first source/drain contact plug CNT_c1 in the second horizontal direction (Y) may be greater than a length of the second source/drain contact plug CNT_c2 in the second horizontal direction (Y).

In another example embodiment, the contact plugs CNT may further include dummy contact plugs CNT_d in contact with the dummy source/drain regions SD_d on the dummy source/drain regions SD_d.

In another example embodiment, the dummy contact plugs CNT_d may be omitted. When the dummy contact plugs CNT_d are omitted, an overall upper surface of the dummy source/drain regions SD may be in contact with the interlayer insulating layer 60.

A first upper interlayer insulating layer 70 and a second upper interlayer insulating layer 80 may be disposed on the interlayer insulating layer 60.

Lower vias V0 in contact with and electrically connected to the contact plugs CNT may be disposed on the contact plugs CNT. Lower wirings M1 electrically connected to the upper vias V0 may be disposed on the lower vias V0. Upper vias V1 electrically connected to the lower wirings M1 may be disposed on the lower wirings M1. Upper wirings M2 electrically connected to the upper vias V1 may be disposed on the upper vias V1. The vias V0 and V1 and the wirings M1 and M2 may be formed of a conductive material.

In an example embodiment, each of the lower vias V0 and the lower wirings M1 may have a damascene structure in the first upper interlayer insulating layer 70. In an example embodiment, each of the upper vias V1 and the lower wirings M2 may have a damascene structure in the second upper interlayer insulating layer 80.

In the description below, a modified example of a semiconductor device will be described with reference to FIGS. 11, 12, and 13 according to an example embodiment.

Figure 11:
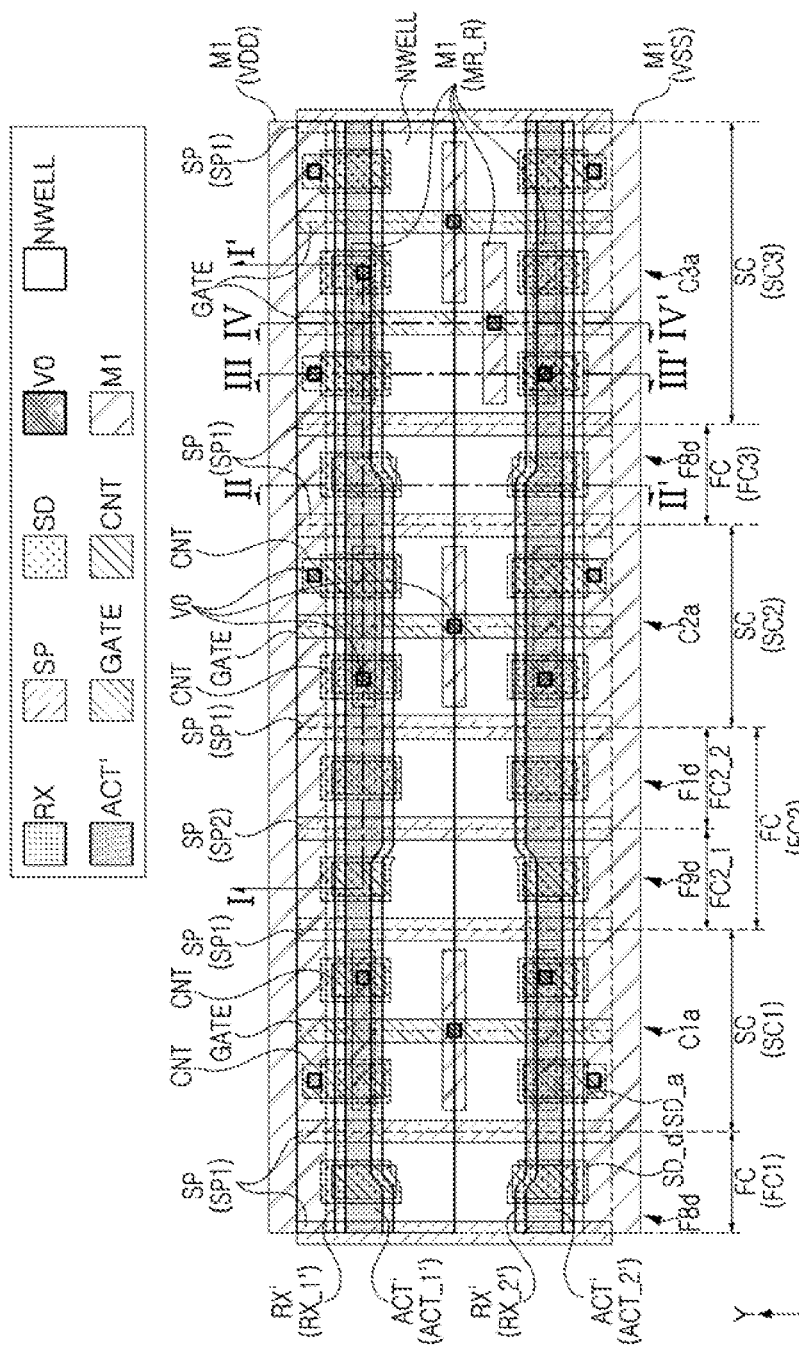
FIG. 11 is a cross-sectional diagram illustrating a semiconductor device according to an example embodiment.

FIG. 11 is a plan diagram the example illustrated in FIG. 8 which further includes base lines RX'. FIG. 12 is a plan diagram illustrating a portion of the example illustrated in FIG. 9 which further includes base lines RX'. FIG. 13 is a cross-sectional diagram illustrating the example illustrated in the cross-sectional diagram taken along lines II-IF and in FIG. 10B, which further includes the base lines RX'. In the description below, the base lines RX' added to the examples illustrated in FIGS. 8C, 9 and 13 will mainly be described with reference to FIGS. 11 to 13.

Figure 12:
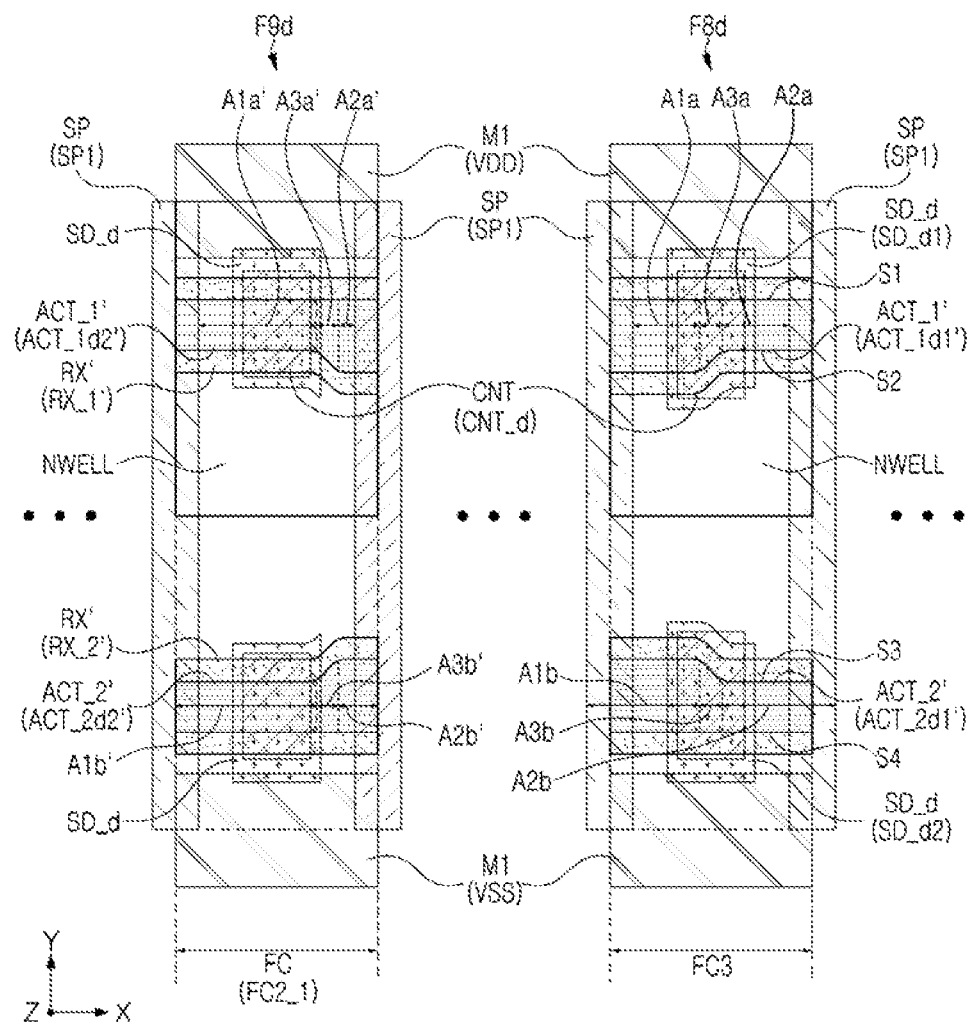
FIG. 12 is an enlarged diagram illustrating a portion of the semiconductor device illustrated in FIG. 11.
Figure 13:
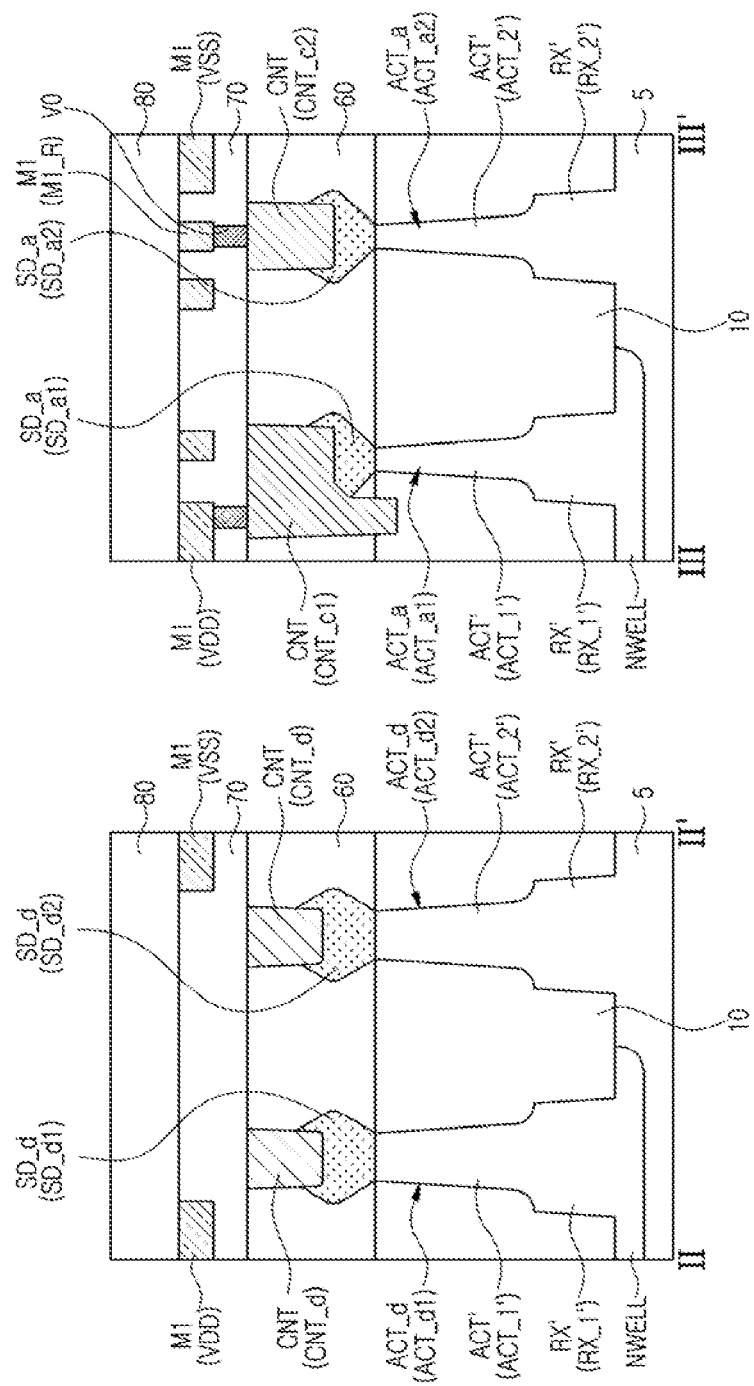
FIG. 13 is cross-sectional diagrams illustrating a semiconductor device according to an example embodiment.

In an example embodiment, referring to FIGS. 11 to 13, the base lines RX' may be disposed on a semiconductor substrate 5. Active lines ACT' may be disposed on the base lines RX'. A width of each of the active lines ACT' may be less than a width of each of the base lines RX'. In an example embodiment, each of the base lines RX' may have a planar shape substantially the same as a shape of each of the active lines ACT', and may have a width greater than a width of each of the active lines ACT'.

An isolation layer 10 may extend to cover side surfaces of the base lines RX'.

The filler cells F1 to F39 described with reference to FIGS. 5A to 5F may be formed using an active line having a first width and an active line having a second width different from the first width. In another example embodiment, the filler cells may be formed using active lines having three or more different widths. An example embodiment of the filler cells including the active lines having different widths will be described with reference to FIG. 14A.

Figure 14A:
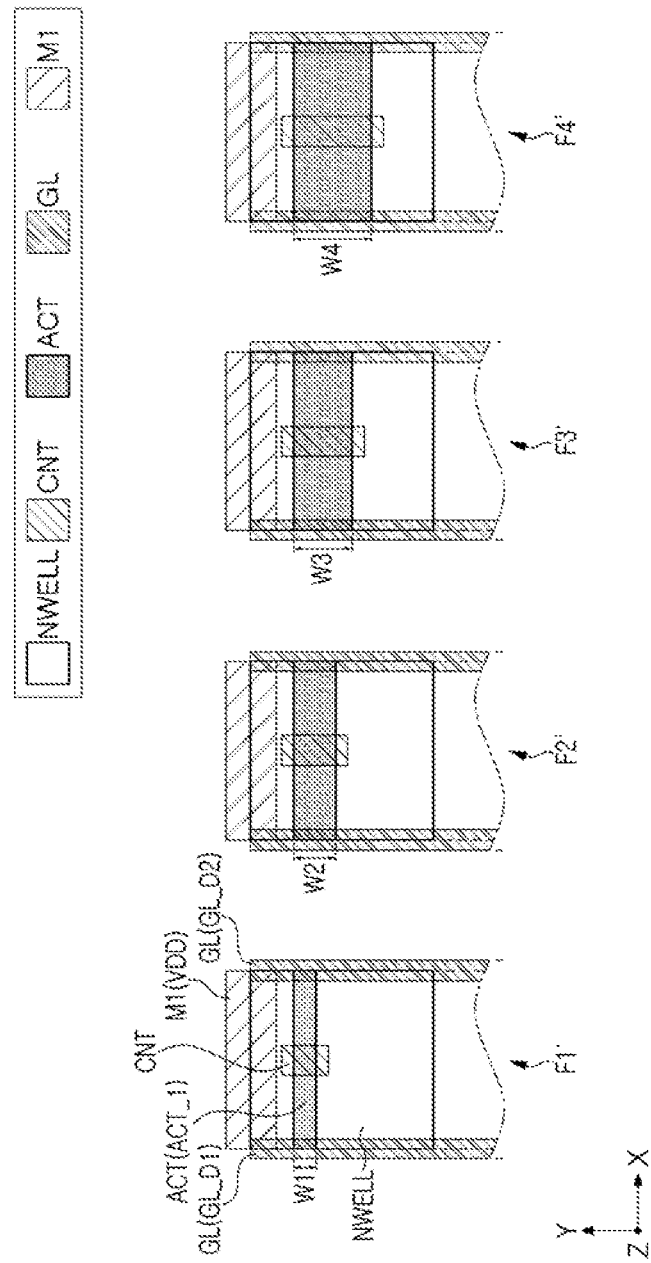
FIGS. 14A to 14C are plan diagrams illustrating a modified example of filler cells included in a semiconductor device according to an example embodiment.

Referring to FIG. 14A, a filler cell F1' may have an active line ACT having a first width W1, a filler cell F2' may have an active line ACT having a second width W2 greater than the first width W1, a filler cell F3' may include an active line ACT having a third width W3 greater than the second width W2, and a filler cell F4' may include an active line ACT having a fourth width W4 greater than the third width W3.

In an example embodiment, the filler cells may be formed by combining the active lines having the first to fourth widths W1 to W4 in various manners. An example embodiment of the filler cell including a single active line, which may be formed using the active lines having different widths, will be described with reference to FIGS. 14B and 14C.

Figure 14B:
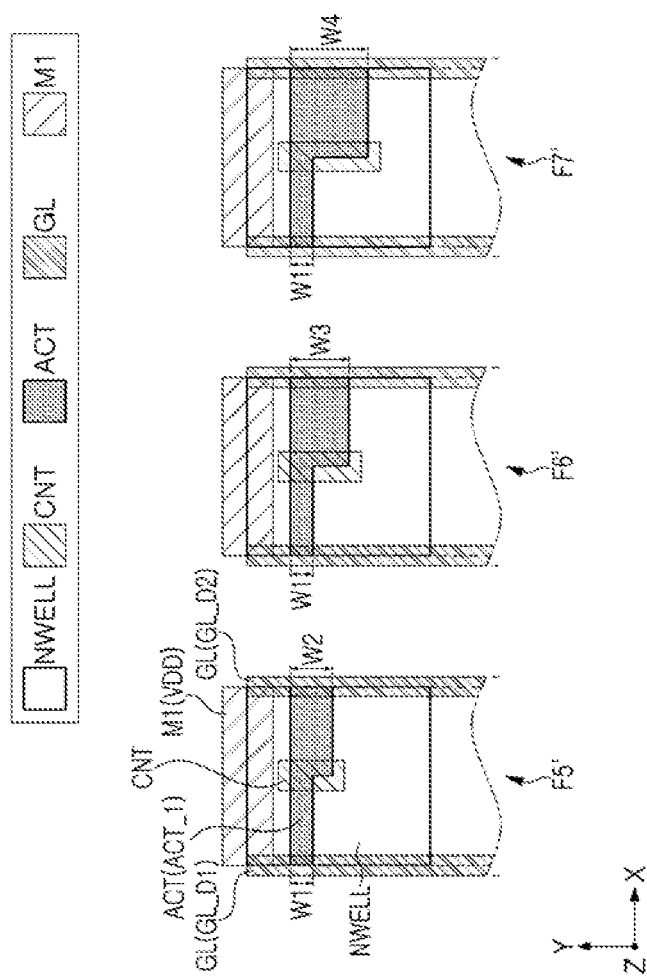
Figure 14C:
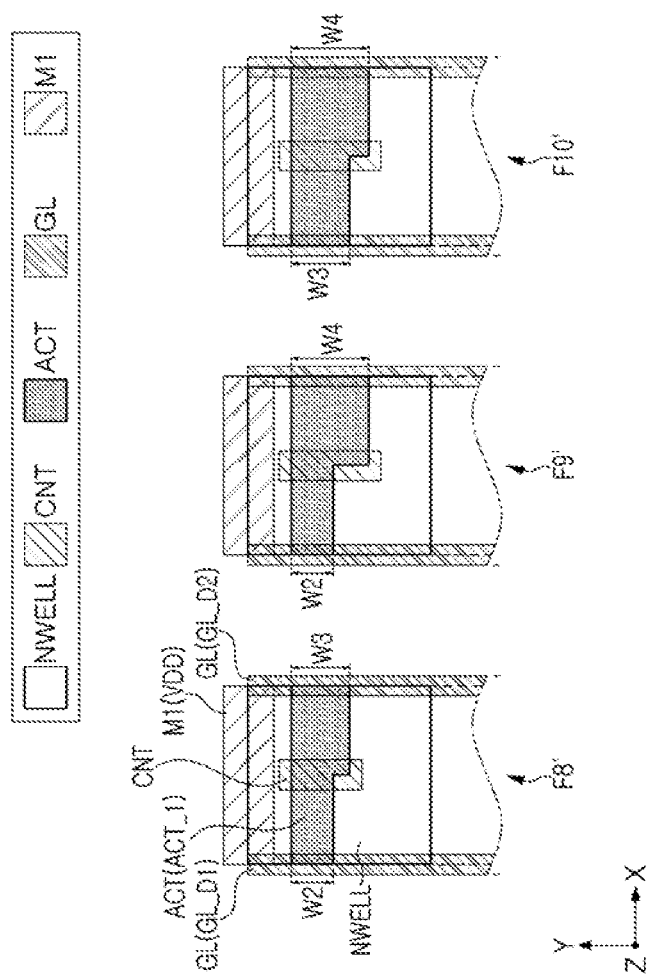

Referring to FIGS. 14B and 14C, a filler cell F5' may include an active line ACT including a portion having the first width W1 and a portion having the second width W2, and a filler cell F6' may include an active line ACT including a portion having the first width W1 and a portion having the third width W3. A filler cell F7' may include an active line ACT including a portion having the first width W1 and a portion having the fourth width W4, and a filler cell F8' may include an active line ACT including a portion having the second width W2 and a portion having the third width W3. A filler cell F9' may include an active line ACT including a portion having the second width W2 and a portion having the fourth width W4, and a filler cell F10' may include an active line ACT including a portion having the third width W3 and a portion having the fourth width W4.

In an example embodiment, the active line ACT having the first to fourth widths W1 to W4 may be applied to the filler cell and also to a standard cell. Accordingly, each of the active lines ACT' described with reference to FIGS. 8A to 8C may be replaced with an active line having two or more widths, instead of two different widths.

The filler cell and the standard cell described above may be formed using the active lines having different widths. In another example embodiment, an active line having the narrowest width may be designated as a reference active line, and a portion of the active line having an increased width may be replaced with a plurality of the reference active lines. The above-described example embodiment will be described with reference to FIGS. 15A to 15C.

Figure 15A:
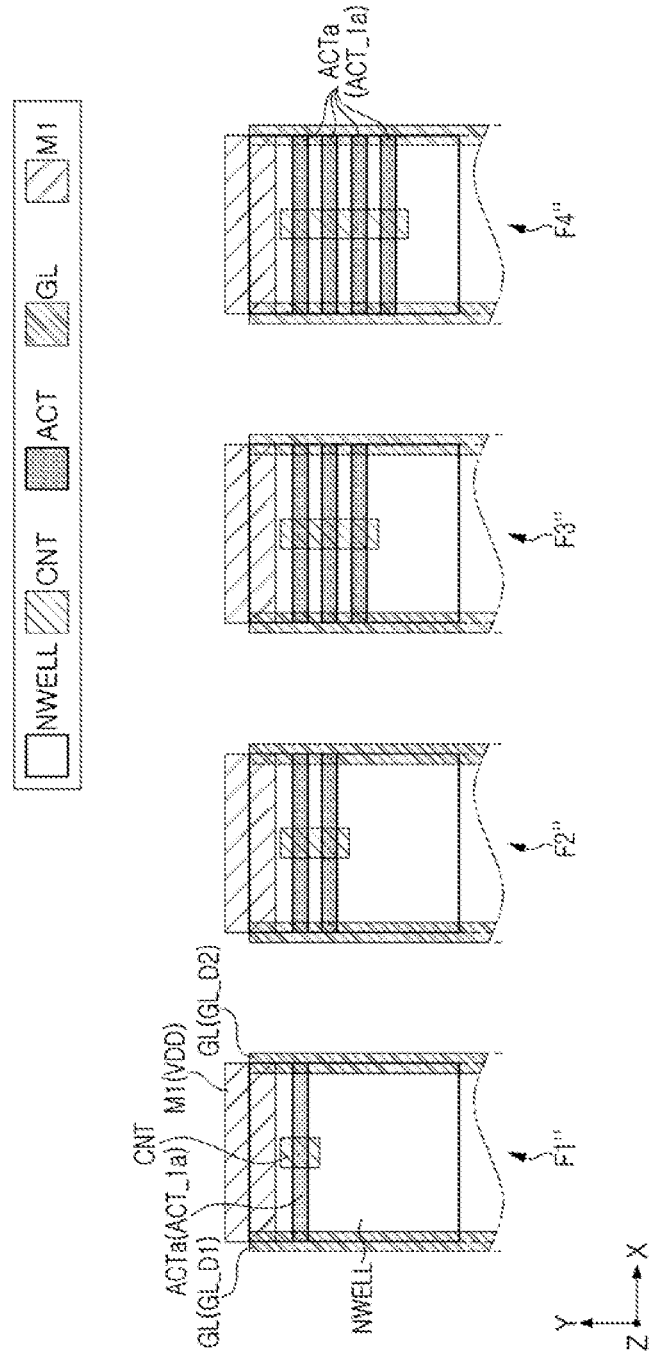
FIGS. 15A to 15C are plan diagrams illustrating another modified example of filler cells included in a semiconductor device according to an example embodiment.
Figure 15B:
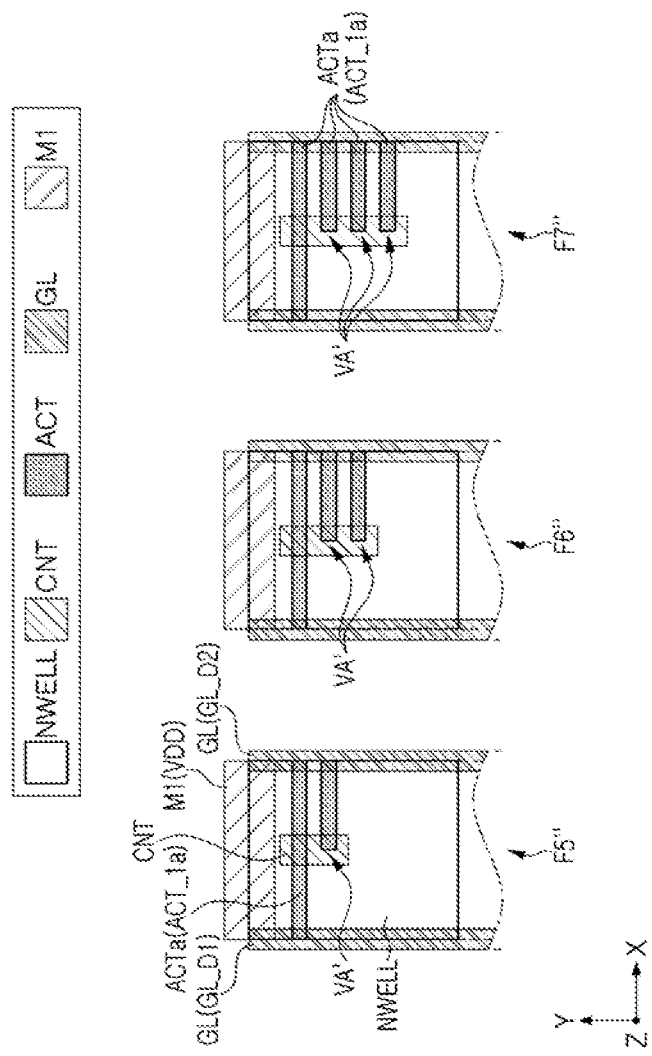
Figure 15C:
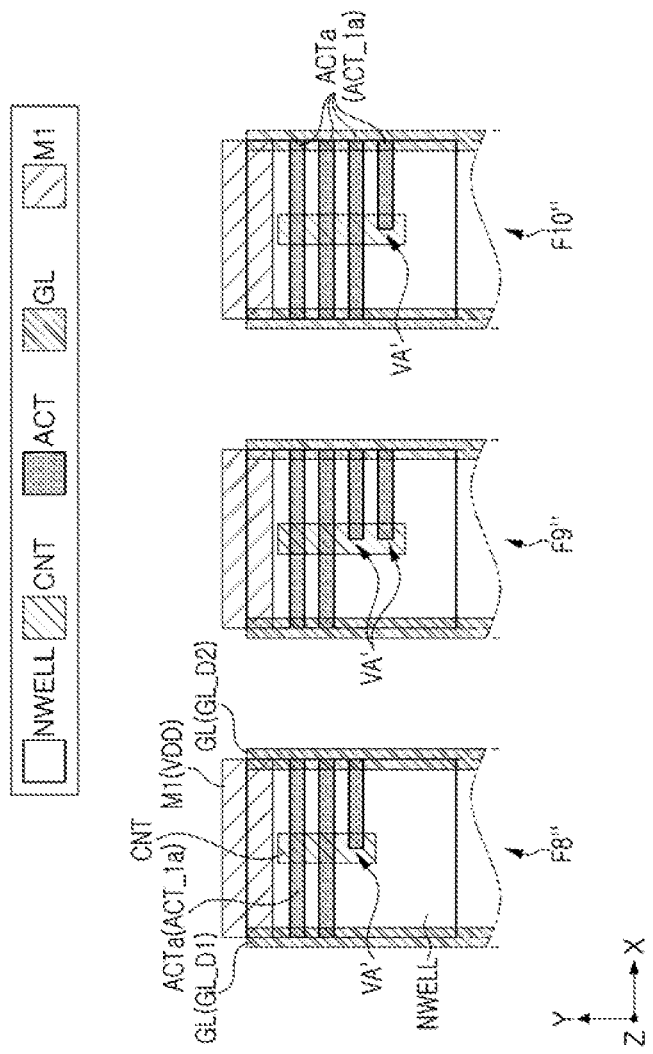

FIGS. 15A to 15C illustrate filler cells F1" to F10" corresponding to the filler cells F1' to F10' illustrated in FIGS. 14A to 14C.

Referring to FIGS. 14A and 15A, a filler cell F1" corresponding to the filler cell F1' illustrated in FIG. 14A may be provided. A filler cell F2" which replaces the filler cell F2' illustrated in FIG. 14A with two active lines ACTa may be provided. A filler cell F3" which replaces the filler cell F3' illustrated in FIG. 14A with three active lines ACTa may be provided. A filler cell F4" which replaces the filler cell F4' illustrated in FIG. 14A with four active lines ACTa may be provided.

Referring to FIGS. 14B, 14C, 15B, and 15C, the active lines of the filler cells F5' to F10' (described in FIGS. 14B and 14C) may be replaced with those of filler cells F5" to F10" (which include a plurality of active lines), as described in FIGS. 15B and 15C using the method described with reference to FIG. 15A. For example, in FIGS. 14B and 14C, the active line having the second width W2 may be replaced with two active lines, the active line having the third width W3 may be replaced with three active lines, and the active line having the fourth width W4 may be replaced with fourth active lines.

As described above, a semiconductor device may be formed by applying the filler cells formed by replacing a single active line with a plurality of active lines, e.g., the filler cells F5" to F10".

The first active line ACT_1' described with reference to FIGS. 8A to 8C may be configured as a single active line including portions having different widths. The second active line ACT_2' may be a single active line including portions having different widths. In the first active line ACT_1' described with reference to FIGS. 8A to 8C, the portions having different widths may be replaced with the different number of active lines. In the second active line ACT_2', the portions having different widths may be replaced with the different number of active lines. The active lines that may replace the first active line ACT_1' and the second active line ACT_2' described with reference to FIGS. 8A to 8C will be described with reference to FIGS. 16A and 16B.

Figure 16A:
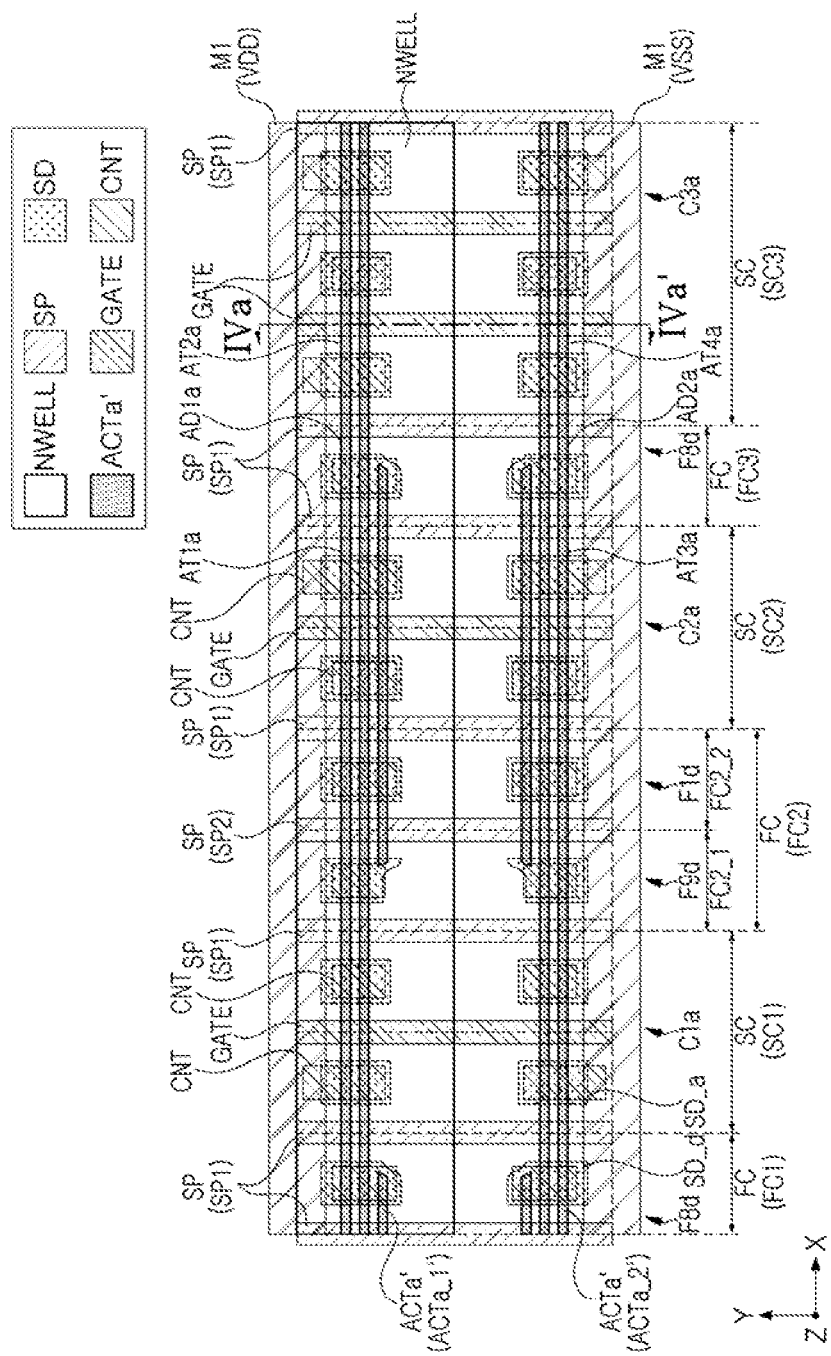
FIG. 16A is a plan diagram illustrating a modified example of a semiconductor device according to an example embodiment.
Figure 16B:
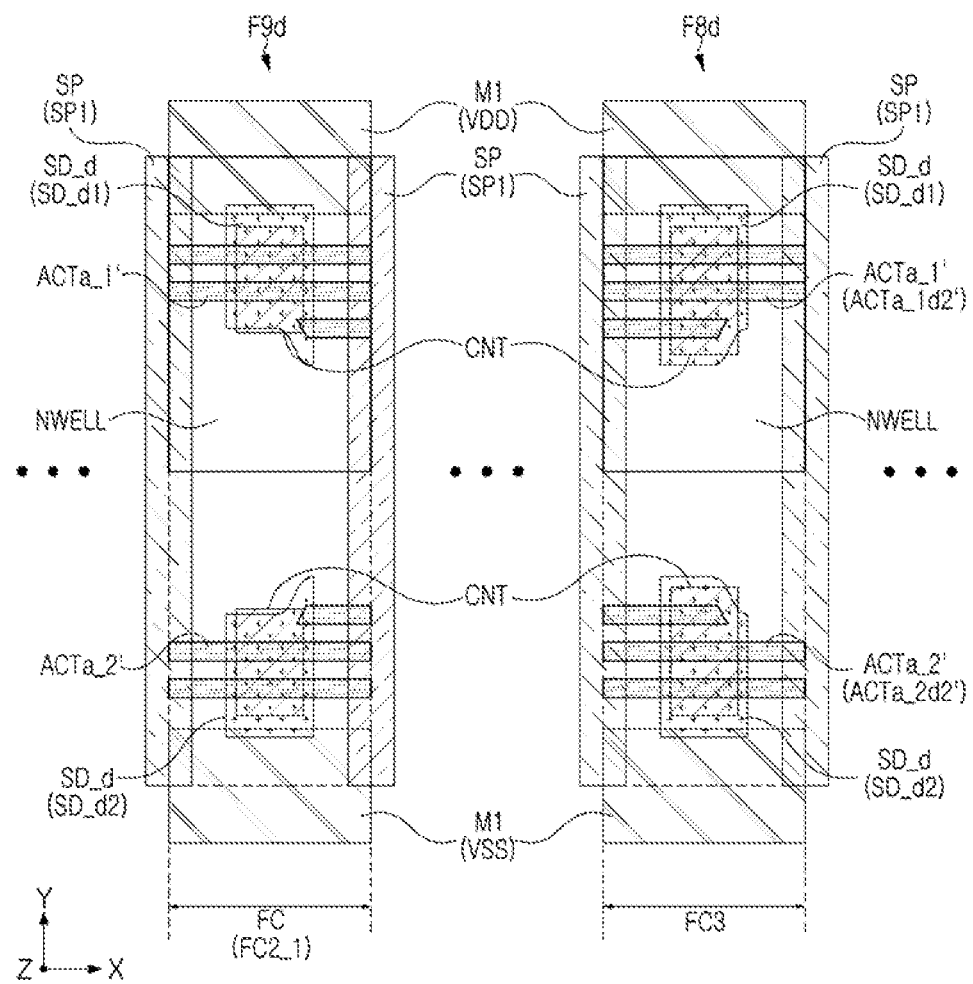
FIG. 16B is an enlarged diagram illustrating a portion of the semiconductor device illustrated in FIG. 16A.

FIG. 16A is a plan diagram illustrating the example embodiment in which a relatively narrow portion of each of the first active line ACT_1' and the second active line ACT_2' illustrated in FIG. 8C (i.e., having a relatively small width) is replaced with two active lines, and a relatively wide portion (i.e., having a relatively great width) is replaced with three active lines. FIG. 16B is an enlarged plan diagram illustrating a portion of the example embodiment in which a relatively narrow portion of each of the first active line ACT_1' and the second active line ACT_2' illustrated in FIG. 9 (i.e., having has a relatively small width) is replaced with two active lines (or active fins), and a relatively wide portion (i.e., having a relatively great width) is replaced with three active lines (or active fins). In the description below, the portions of each of the first active line ACT_1' and the second active line ACT_2' that have a relatively smaller width (and are replaced with two active lines (or active fins)), and the portion having a relatively great width (replaced with three active lines (or active fins)) will mainly be described.

Figure 17:
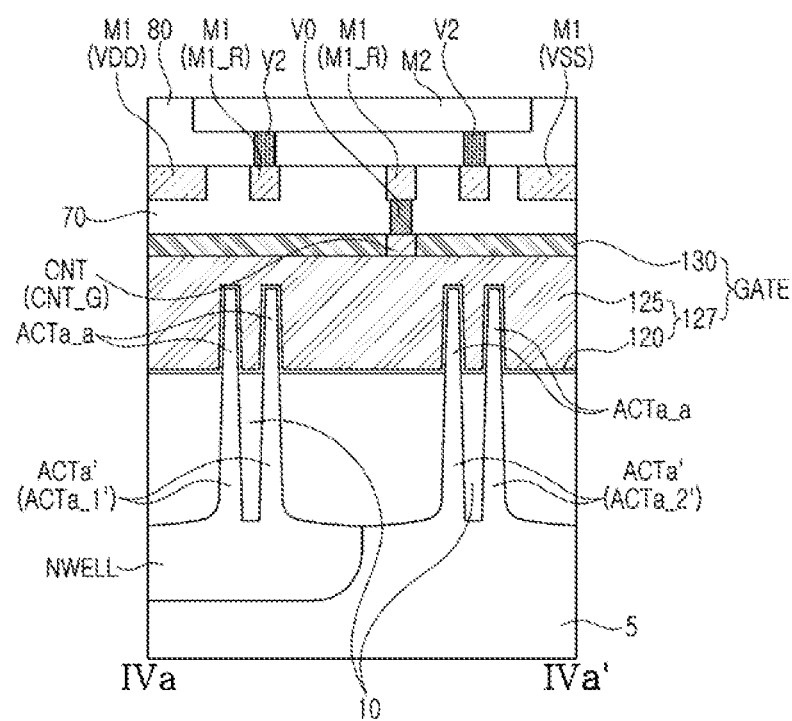
FIG. 17 is cross-sectional diagrams illustrating a semiconductor device according to an example embodiment.

Referring to FIGS. 16A, 16B, and 17, the first active line ACT_1' (in FIGS. 8A to 8C) described with reference to FIGS. 8A to 8C and 9 may be replaced with first active fins ACTa_1'. The second active line ACT_2' (in FIGS. 8A to 8C) described with reference to FIGS. 8A to 8C and 9 may be replaced with second active fins ACTa_2'. Accordingly, the active line ACT' described with reference to FIGS. 8A to 8C and 9 may be replaced with the active lines ACTa' including the first and second active fins ACTa_1' and ACTa_2'.

In the first active line ACT_1' (in FIGS. 8A to 8C) described with reference to FIGS. 8A to 8C, a first active portion AT1 (of the first active line ACT_1' in FIGS. 8A to 8C) having a relatively great width may be replaced with a first active portion AT1a (in FIG. 16A) including a relatively great number of the first active lines ACT_1'. In the first active line ACT_1' (in FIGS. 8A to 8C) described with reference to FIGS. 8A to 8C, a second active portion AT2 (of the first active line ACT_1' in FIGS. 8A to 8C) having a relatively small width may be replaced with a second active portion AT2a (in FIG. 16A) including a relatively small number of the first active lines ACT_1'. In the first active line ACT_1' (in FIGS. 8A to 8C) described with reference to FIGS. 8A to 8C and 9, a dummy portion AD1 including a width-changing portion may be replaced with a dummy portion AD1a including a varied number of first active lines ACT_1'. For example, a portion having a relatively thin width of the active lines ACT' illustrated in FIGS. 8A to 8C and 9 may be replaced with two active fins, and a portion having a relatively great width of the active lines ACT' illustrated in FIGS. 8A to 8C and 9 may be replaced with three active fins.

In FIGS. 10A and 10C illustrating a cross-sectional structure of the example illustrated in FIGS. 8A to 8C, the semiconductor layers 15 (in FIGS. 10A and 10C) may be omitted. The gate 27 (in FIGS. 10A and 10C) illustrated in FIGS. 10A and 10C may be replaced with a gate 127 covering upper surfaces and side surfaces of protrusions ACTa_a (in FIG. 17) of the first and second active fins ACTa_1' and ACTa_2' (in FIG. 17). The gate 127 may include a gate dielectric 120 and a gate electrode 125 on the gate dielectric 120. A gate capping layer 130 may be disposed on the gate 127. The gate 127 and the gate capping layer 130 may be included in a gate line GATE.

In the description below, the cross-sectional structure of a semiconductor device illustrated in FIG. 17 which further includes base lines RX' will be described.

Figure 18:
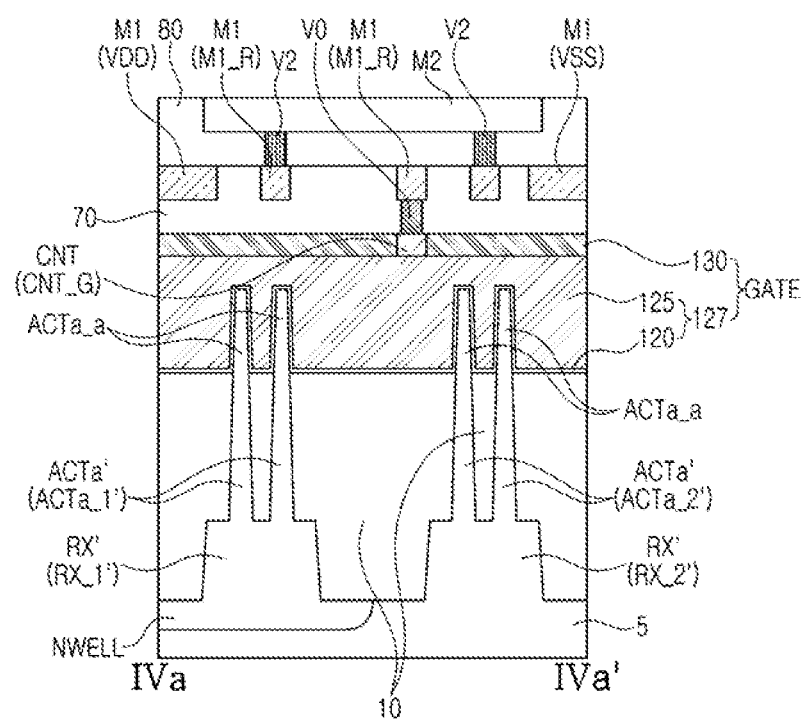
FIG. 18 is a cross-sectional diagram illustrating a modified example of a semiconductor device according to an example embodiment.

Referring to FIG. 18, in the cross-sectional structure illustrated in FIG. 17, base lines RX' may be disposed between active fins ACTa' and a semiconductor substrate 5. The base lines RX' may include a first base line RX_1' disposed in the N-well region NWELL and a second base line RX_2' spaced apart from the first base line RX_1'.

Figure 19:
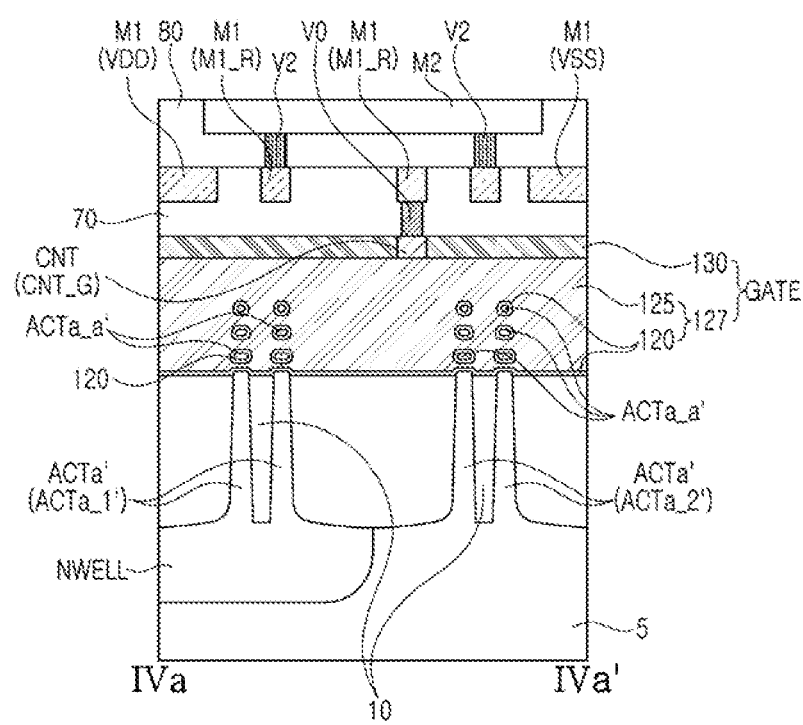
FIG. 19 is a cross-sectional diagram illustrating another modified example of a semiconductor device according to an example embodiment.

Referring to FIG. 19, in the cross-sectional structure illustrated in FIG. 17, protrusions ACTa_a of the active fins ACTa' covered by the gates 127 may be replaced with nanowires ACTa_a. Each of the nanowires ACTa_a may be surrounded by the gate 127.

As described above, embodiments relate to a method of forming a layout and a semiconductor device manufactured by the method.

Embodiments may provide a semiconductor device having an increased integration density.

Embodiments may provide a semiconductor device that exhibits improved reliability.

As described above, a dummy region including a dummy active portion may be disposed between a first circuit region including a first circuit active portion having a first width and a second circuit region including a second circuit active portion having a second width different from the first width.

The dummy active portion may include a first dummy portion having the first width which has continuity with the first circuit active portion, a second dummy portion having the second width having continuity with the second circuit active portion, and a width-changing portion disposed between the first dummy portion and the second dummy portion.

The first dummy portion may be disposed between the width-changing portion and the first circuit active portion. The second dummy portion may be disposed between the width-changing portion and the second circuit active portion. The first dummy portion and the second dummy portion may work as a buffer that prevents widths of the first circuit active portion and the second circuit active portion from changing.

Accordingly, each of the first circuit active portion and the second circuit active portion may be configured to have a uniform width, such that properties of a device formed in the first circuit region and the second circuit region (for example, a transistor) may be prevented from changing. Consequently, reliability of the semiconductor device may improve, and distributive properties may improve. Also, a gap between the first circuit region and the second circuit region (a size of the dummy region) may be reduced. Thus, a semiconductor device having reliability may be manufactured, and integration density of the semiconductor device may improve.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
  a pair of first and second dummy active regions extending in a first horizontal direction and spaced apart from each other in a second horizontal direction perpendicular to the first horizontal direction;
  a pair of first and second circuit active regions extending in the first horizontal direction and spaced apart from each other in the second horizontal direction;
  a plurality of line patterns extending in the second horizontal direction and spaced apart from each other in the first horizontal direction;
  a first dummy source/drain region on the first dummy active region, and a second dummy source/drain region on the second dummy active region; and a first circuit source/drain region on the first circuit active region, and a second circuit source/drain region on the second circuit active region, wherein:

the pair of first and second dummy active regions are disposed between a pair of line patterns adjacent to each other among the plurality of line patterns, at least one of the first and second dummy active regions has a width-changing portion, the width-changing portion being a portion in which a width of the at least one of the first and second dummy active regions changes in the second horizontal direction between the pair of line patterns adjacent to each other, each of the first and second circuit source/drain regions has a symmetrical structure in plan view, and at least one of the first and second dummy source/drain regions has an asymmetrical structure in plan view.

2. The semiconductor device as claimed in claim 1, wherein, in plan view, the first dummy active region has a first dummy active side surface and a second dummy active side surface opposing each other, the second dummy active region has a third dummy active side surface and a fourth dummy active side surface opposing each other, the second dummy active side surface and the third dummy active side surface oppose each other, and each of the first dummy active side surface of the first dummy active region and the fourth dummy active side surface of the second dummy active region has a substantially straight linear line shape in plan view.

3. The semiconductor device as claimed in claim 2, wherein the second dummy active side surface of the first dummy active region has a bent portion in plan view.

4. The semiconductor device as claimed in claim 3, wherein the third dummy active side surface of the second dummy active region has a bent portion in plan view.

5. The semiconductor device as claimed in claim 1, wherein:

the first dummy active region includes a first width portion, a second width portion, and a first width-changing portion between the first width portion and the second width portion, a width of the first width portion in the second horizontal direction is greater than a width of the second width portion in the second horizontal direction, and a length of the first width portion in the first horizontal direction is substantially the same as a length of the second width portion in the first horizontal direction.

6. The semiconductor device as claimed in claim 1, wherein:

the first dummy active region includes a first width portion, a second width portion, and a first width-changing portion between the first width portion and the second width portion, a width of the first width portion in the second horizontal direction is greater than a width of the second width portion in the second horizontal direction, and a length of the first width portion in the first horizontal direction is different from a length of the second width portion in the first horizontal direction.

7. The semiconductor device as claimed in claim 1, wherein:

the first dummy active region includes a first width portion, a second width portion, and a first width-changing portion between the first width portion and the second width portion, a width of the first width portion in the second horizontal direction is greater than a width of the second width portion in the second horizontal direction, the second dummy active region includes a third width portion, a fourth width portion different from the third width portion, and a second width-changing portion between the third width portion and the fourth width portion, and a width of the third width portion in the second horizontal direction is greater than a width of the fourth width portion in the second horizontal direction.

8. The semiconductor device as claimed in claim 7, wherein the first width portion and the third width portion oppose each other.

9. The semiconductor device as claimed in claim 1, wherein:

the first dummy active region includes a first width portion, a second width portion, and a first width-changing portion between the first width portion and the second width portion, a width of the first width portion in the second horizontal direction is greater than a width of the second width portion in the second horizontal direction, the second dummy active region includes a third width portion, a fourth width portion different from the third width portion, and a second width-changing portion between the third width portion and the fourth width portion, and a width of the third width portion in the second horizontal direction is smaller than a width of the fourth width portion in the second horizontal direction.

10. The semiconductor device as claimed in claim 1, further comprising:

an interlayer insulating layer covering an overall upper surface of each of the first and second dummy source/drain regions;

a first source/drain contact plug electrically connected to the first circuit source/drain region; and a second source/drain contact plug electrically connected to the second circuit source/drain region.

11. A semiconductor device, comprising:

a semiconductor substrate;

a first active line extending on the semiconductor substrate in a first horizontal direction and crossing a first circuit region, a dummy region, and a second circuit region;

a second active line extending on the semiconductor substrate in the first horizontal direction and crossing the first circuit region, the dummy region, and the second circuit region; and line patterns extending on the semiconductor substrate in a second horizontal direction perpendicular to the first horizontal direction, wherein:

the first active line is disposed in an N-well region of the semiconductor substrate, the second active line is spaced apart from the N-well region of the semiconductor substrate, the dummy region is disposed between the first circuit region and the second circuit region, the first active line includes a first circuit active portion in the first circuit region, a first dummy active portion in the dummy region, and a second circuit active portion in the second circuit region, the second active line includes a third circuit active portion in the first circuit region, a second dummy active portion in the dummy region, and a fourth circuit active portion in the second circuit region, at least a portion of the first dummy active portion has a width different from a width of at least a portion of the second dummy active portion, the first circuit active portion has a first width in the second horizontal direction that is uniform across an entire width of the first circuit region in the first horizontal direction, and the second circuit active portion has a second width in the second horizontal direction that is uniform across an entire width of the second circuit region in the first horizontal direction, the second width being different from the first width.

12. The semiconductor device as claimed in claim 11, wherein:

the line patterns include a pair of dummy lines adjacent to each other, the first dummy active region is disposed between the pair of dummy lines, the first dummy active portion includes a first width portion having a width the same as the first width, a second width portion having a width the same as the second width, and a first width-changing portion between the first width portion and the second width portion, the first width-changing portion is disposed between the pair of dummy lines, and the pair of dummy lines bound the first dummy active portion and bound the second dummy active portion.

13. The semiconductor device as claimed in claim 12, wherein the first width-changing portion of the first dummy active portion is adjacent to one of the pair of dummy lines.

14. The semiconductor device as claimed in claim 11, further comprising:

a plurality of first semiconductor layers stacked in the first circuit active portion and spaced apart from each other;

a plurality of second semiconductor layers stacked in the third circuit active portion and spaced apart from each other;

a device gate line extending in the second horizontal direction and overlapping the plurality of first semiconductor layers and the plurality of second semiconductor layers in the first circuit region;

first circuit source/drain regions disposed on both sides of the device gate line on the first circuit active portion and connected to the plurality of first semiconductor layers;

second circuit source/drain regions disposed on both sides of the device gate line on the second circuit active portion and connected to the plurality of second semiconductor layers;

first source/drain contact plugs electrically connected to the first circuit source/drain regions; and second source/drain contact plugs electrically connected to the second circuit source/drain regions.

15. The semiconductor device as claimed in claim 14, wherein:

one of the first source/drain contact plugs has a first length in the second horizontal direction, and the other of the first source/drain contact plugs has a second length different from the first length in the second horizontal direction.

16. The semiconductor device as claimed in claim 15, further comprising:

a power wiring;

a routing wiring having a width less than a width of the power wiring;

a first lower via disposed below the power wiring; and a second lower via disposed below the routing wiring, wherein:

the first length is greater than the second length, a contact plug of the first source/drain contact plugs having the first length is electrically connected to the power wiring through the first lower via, and a contact plug of the first source/drain contact plugs having the second length is electrically connected to the routing wiring through the second lower via.

17. The semiconductor device as claimed in claim 11, further comprising a first base line extending in the first horizontal direction on the semiconductor substrate, wherein:

the first active line is disposed on the first base line, and the first base line has a width greater than a width of the first active line.

18. A semiconductor device, comprising:

a semiconductor substrate;

an active line extending on the semiconductor substrate in a first horizontal direction and crossing, in sequence, a first circuit region, a dummy region, and a second circuit region;

a first line pattern extending on the semiconductor substrate in a second horizontal direction perpendicular to the first horizontal direction at a first side of the first circuit region;

a second line pattern extending on the semiconductor substrate in the second horizontal direction at a second side of the first circuit region, the second line pattern being at a boundary of the first circuit region and the dummy region;

a third line pattern extending on the semiconductor substrate in the second horizontal direction at a first side of the second circuit region, the third line pattern being at a boundary of the dummy region and the second circuit region;

a fourth line pattern extending on the semiconductor substrate in the second horizontal direction at a second side of the second circuit region;

respective circuit source/drain regions above the active line in the first and second circuit regions; and respective pluralities of semiconductor layers disposed on the active line in the first and second circuit regions, wherein:

the active line in the first circuit region has a first width in the second horizontal direction that is uniform across an entire width in the first horizontal direction between the first line pattern and the second line pattern, the active line in the second circuit region has a second width in the second horizontal direction that is uniform across an entire width in the first horizontal direction between the third line pattern and the fourth line pattern, the second width being different from the first width, the active line in the dummy region includes a first width portion having the first width and a second width portion having the second width.

* * * * *